United States Patent
Furuya et al.

(10) Patent No.: US 10,133,187 B2
(45) Date of Patent: *Nov. 20, 2018

(54) LIGHT IRRADIATION APPARATUS AND DRAWING APPARATUS

(71) Applicant: SCREEN Holdings Co., Ltd., Kyoto (JP)

(72) Inventors: Yoshio Furuya, Kyoto (JP); Masahiko Kokubo, Kyoto (JP); Fujikazu Kitamura, Kyoto (JP); Masaki Sasada, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 42 days.

This patent is subject to a terminal disclaimer.

(21) Appl. No.: 14/725,059

(22) Filed: May 29, 2015

(65) Prior Publication Data

US 2016/0349625 A1    Dec. 1, 2016

(51) Int. Cl.
  *G03B 27/54*    (2006.01)
  *G03F 7/20*     (2006.01)
  (Continued)

(52) U.S. Cl.
  CPC ......... *G03F 7/70191* (2013.01); *G02B 3/005* (2013.01); *G02B 19/0019* (2013.01);
  (Continued)

(58) Field of Classification Search
  CPC ............. G03F 7/70008; G03F 7/70025; G03F 7/70041; G03F 7/7005; G03F 7/70075;
  (Continued)

(56) References Cited

U.S. PATENT DOCUMENTS

| 4,619,508 A | 10/1986 | Shibuya et al. ............... 353/122 |
| 5,923,475 A | 7/1999 | Kurtz et al. .................. 359/619 |

(Continued)

FOREIGN PATENT DOCUMENTS

| CN | 1467533 A | 1/2004 |
| CN | 1530707 A | 9/2004 |

(Continued)

OTHER PUBLICATIONS

Extended European Search Report dated Nov. 17, 2015 in corresponding European Patent Application No. 15169831.3.

*Primary Examiner* — Christina Riddle
(74) *Attorney, Agent, or Firm* — Ostrolenk Faber LLP

(57) ABSTRACT

A light irradiation apparatus (31) includes a light source unit (40) and an irradiation optical system (5). In the light source unit, light source parts (4) arrayed in a plane emit laser light toward the irradiation optical system from different directions along the plane, and by the irradiation optical system, the laser light is guided along an optical axis (J1) to an irradiation plane (320). The irradiation optical system includes a division lens part (62), an optical path length difference generation part (61), and a condensing lens part (63). The division lens part includes element lenses (620) that divide light incident from the light source parts. The optical path length difference generation part includes transparent parts (610) having different optical path lengths from each other, and light that has passed through the element lenses respectively enters the transparent parts. The condensing lens part superimposes irradiation regions (50) of the light from the transparent parts on each other on the irradiation plane. Accordingly, the irradiation plane can be irradiated with high-intensity light having a uniform intensity distribution.

3 Claims, 16 Drawing Sheets

(51) Int. Cl.
  *G02B 3/00* (2006.01)
  *G02B 19/00* (2006.01)
(52) U.S. Cl.
  CPC ....... *G02B 19/0047* (2013.01); *G03F 7/7005*
       (2013.01); *G03F 7/70075* (2013.01); *G03F*
                              *7/70291* (2013.01)
(58) Field of Classification Search
  CPC ............. G03F 7/70091; G03F 7/70291; G03F
        7/70191; G02B 3/0043; G02B 3/005;
        G02B 19/0019; G02B 19/0047; G02B
        19/0057; G02B 19/0066
  USPC ....... 355/52, 53, 55, 67–71, 75–77;
        250/492.1, 492.2, 492.21, 492.22, 493.1,
        250/548; 362/553, 558, 619, 486.01;
        359/619, 486.01
  See application file for complete search history.

(56) References Cited

U.S. PATENT DOCUMENTS

| | | | | |
|---|---|---|---|---|
| 6,312,134 | B1* | 11/2001 | Jain | G03F 7/70291 |
| | | | | 355/35 |
| 6,449,098 | B1* | 9/2002 | Helkey | G02B 3/0012 |
| | | | | 359/619 |
| 2002/0024740 | A1 | 2/2002 | Hashimoto | 359/619 |
| 2002/0027716 | A1 | 3/2002 | Tanaka | 359/621 |
| 2002/0036904 | A1* | 3/2002 | Kawashima | G03F 7/7005 |
| | | | | 362/276 |
| 2002/0085276 | A1* | 7/2002 | Tanitsu | G03F 7/70066 |
| | | | | 359/432 |
| 2003/0234751 | A1 | 12/2003 | Hwang | 345/32 |
| 2004/0201826 | A1 | 10/2004 | Nishida et al. | 353/75 |
| 2005/0219493 | A1 | 10/2005 | Oshida et al. | 355/67 |
| 2008/0013065 | A1* | 1/2008 | Kohl | G03F 7/70108 |
| | | | | 355/67 |
| 2008/0293258 | A1 | 11/2008 | Akita et al. | 438/795 |
| 2010/0045936 | A1 | 2/2010 | Inoue | 353/30 |
| 2010/0283985 | A1* | 11/2010 | Layh | G03F 7/70116 |
| | | | | 355/67 |
| 2012/0081786 | A1* | 4/2012 | Mizuyama | G02B 27/48 |
| | | | | 359/492.01 |
| 2013/0010215 | A1 | 1/2013 | Taketsu et al. | 349/8 |
| 2013/0038917 | A1 | 2/2013 | Watanabe et al. | 359/225.1 |
| 2016/0041476 | A1* | 2/2016 | Ashida | G03F 7/70191 |
| | | | | 355/71 |

FOREIGN PATENT DOCUMENTS

| | | |
|---|---|---|
| CN | 1697144 A | 11/2005 |
| CN | 203232239 U | 10/2013 |
| DE | 197 51 106 A1 | 5/1998 |
| DE | 11 2005 001 847 B4 | 6/2007 |
| EP | 1 898 648 A2 | 3/2008 |
| JP | 61-169815 | 7/1986 |
| JP | 10-062710 A | 3/1998 |
| JP | 2001-148345 | 5/2001 |
| JP | 2003-218017 A | 7/2003 |
| JP | 2004-12757 | 1/2004 |
| JP | 2004-253750 | 9/2004 |
| JP | 2006-049656 | 2/2006 |
| JP | 2006-234954 | 9/2006 |
| JP | 2008-242238 A | 10/2008 |
| JP | 2012-181498 | 9/2012 |
| KR | 10-2012-0024393 | 3/2012 |
| TW | 200847228 A | 12/2008 |
| TW | 201316035 A1 | 4/2013 |
| WO | WO 2006/013814 A1 | 2/2006 |
| WO | WO 2013/131834 A1 | 9/2013 |

* cited by examiner

LIGHT IRRADIATION APPARATUS AND DRAWING APPARATUS

TECHNICAL FIELD

The present invention relates to a light irradiation apparatus and a drawing apparatus.

BACKGROUND ART

Technologies for uniformly irradiating a predetermined plane with laser light emitted from a light source such as a semiconductor laser have conventionally been proposed. For example, in a light irradiation apparatus in which laser light incident from a light source part is divided by a plurality of lenses in a cylindrical lens array and irradiation regions of the light from the plurality of lenses are superimposed on one another in an irradiation plane by another lens, an optical path length difference generation part is provided between the light source part and the cylindrical lens array. The optical path length difference generation part includes a plurality of transparent parts that produce a difference in optical path length between each other, the difference being longer than the coherence distance (coherence length) of the laser light, and light that has passed through the plurality of transparent parts respectively enters the plurality of cylindrical lenses. This prevents interference fringes from appearing and achieves uniformity of the intensity distribution of the light irradiated onto the irradiation plane (as examples of such an apparatus, see Japanese Patent Application Laid-Open Nos. 61-169815, 2004-12757, and 2006-49656, for example).

Incidentally, in a drawing apparatus in which a spatial light modulator is disposed in the irradiation plane in the above-described light irradiation apparatus and spatially modulated light is irradiated onto an object to draw a pattern, a light irradiation apparatus capable of irradiating the irradiation plane with high-intensity light having a uniform intensity distribution is required in order to increase the speed of pattern drawing.

SUMMARY OF INVENTION

The present invention is intended for a light irradiation apparatus, and it is an object of the present invention to provide a light irradiation apparatus capable of irradiating an irradiation plane with high-intensity light having a uniform intensity distribution.

The light irradiation apparatus according to the present invention includes a light source unit including a plurality of light source parts arrayed in a plane and in which the plurality of light source parts emit laser light toward a predetermined position from different directions along the plane, and an irradiation optical system disposed at the predetermined position and for guiding the laser light emitted from the light source unit along an optical axis to an irradiation plane. The irradiation optical system includes a division lens part including a plurality of lenses arrayed in a direction that is perpendicular to the optical axis and along the plane, and for dividing light incident from the plurality of light source parts by the plurality of lenses, an optical path length difference generation part including a plurality of transparent parts that are arrayed in a direction perpendicular to the optical axis and have different optical path lengths from each other, and in which light that has passed through the plurality of lenses is incident respectively on the plurality of transparent parts, and a condensing lens part disposed closer to the irradiation plane on a path of the laser light than the optical path length difference generation part is, and for superimposing irradiation regions of light from the plurality of transparent parts on each other on the irradiation plane.

According to the present invention, it is possible to irradiate the irradiation plane with high-intensity light having a uniform intensity distribution.

In a preferred embodiment of the present invention, the light irradiation apparatus further includes an intermediate magnification part disposed between the division lens part and the optical path length difference generation part and constituting an enlarging optical system. In this case, the intermediate magnification part preferably constitutes a double telecentric optical system. More preferably, the intermediate magnification part forms images of exit surfaces of the plurality of lenses inside or in the vicinity of the plurality of transparent parts.

In another preferred embodiment of the present invention, the irradiation optical system further includes a reflecting part for causing light that has passed through the optical path length difference generation part and has been emitted from a plurality of exit surfaces of the plurality of transparent parts to return and respectively enter the plurality of exit surfaces. In this case, the reflecting part preferably causes the light emitted from the plurality of exit surfaces to respectively enter the plurality of exit surfaces in parallel with a direction of emission of the light.

In yet another preferred embodiment of the present invention, the division lens part and the optical path length difference generation part are disposed close to each other, and, with respect to an array direction of the plurality of transparent parts, a width of light emitted from an exit surface of each of the plurality of transparent parts is smaller than a pitch of the plurality of transparent parts.

The present invention is also intended for a drawing apparatus. The drawing apparatus according to the present invention includes the above-described light irradiation apparatus, a spatial light modulator disposed in the irradiation plane in the light irradiation apparatus, a projection optical system for guiding light spatially modulated by the spatial light modulator onto an object, a movement mechanism for moving an irradiation position of the spatially modulated light on the object, and a control part for controlling the spatial light modulator in synchronization with the movement of the irradiation position caused by the movement mechanism.

These and other objects, features, aspects and advantages of the present invention will become more apparent from the following detailed description of the present invention when taken in conjunction with the accompanying drawings.

DESCRIPTION OF EMBODIMENTS

Figure 1:
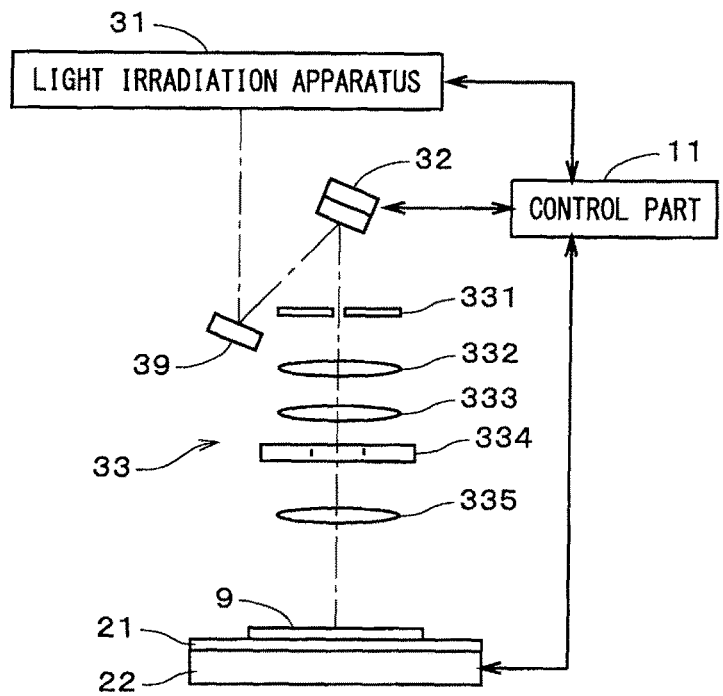
FIG. 1 illustrates a configuration of a drawing apparatus according to a first embodiment.

FIG. 1 illustrates a configuration of a drawing apparatus 1 according to a first embodiment of the present invention. The drawing apparatus 1 is a direct drawing apparatus for drawing a pattern by irradiating a surface of a substrate 9 such as a semiconductor substrate or a glass substrate, to which a photosensitive material is applied, with light rays. The drawing apparatus 1 includes a stage 21, a movement mechanism 22, a light irradiation apparatus 31, a spatial light modulator 32, a projection optical system 33, and a control part 11. The stage 21 holds the substrate 9, and the movement mechanism 22 moves the stage 21 along a main surface of the substrate 9. The movement mechanism 22 may rotate the substrate 9 about an axis perpendicular to the main surface.

The light irradiation apparatus 31 irradiates the spatial light modulator 32 with line beam via a mirror 39. The details of the light irradiation apparatus 31 will be described later. The spatial light modulator 32 is of for example, a diffraction grating type as well as a reflection type, and is a diffraction grating whose grating depth can be changed. The spatial light modulator 32 is manufactured using semiconductor device manufacturing technologies. The diffraction grating type light modulator used in the present embodiment is, for example, GLV (Grating Light Valve), which is a registered trademark of Silicon Light Machines, Sunnyvale, Calif. The spatial light modulator 32 includes a plurality of grating elements arrayed in a row, and each grating element transitions between a state in which first-order diffraction light is emitted and a state in which zero-order diffraction light (zero-order light) is emitted. In this way, spatially modulated light is emitted from the spatial light modulator 32.

The projection optical system 33 includes a douser 331, a lens 332, a lens 333, an aperture plate 334, and a focusing lens 335. The douser 331 blocks off ghost light and part of high-order diffraction light, and passes the light received from the spatial light modulator 32. The lenses 332 and 333 constitute a zoom part. The aperture plate 334 blocks off plus and minus first-order diffraction light (and high-order diffraction light) and passes zero-order diffraction light. The light that has passed through the aperture plate 334 is guided onto the main surface of the substrate 9 by the focusing lens 335. In this way, the light spatially modulated by the spatial light modulator 32 is guided onto the substrate 9 by the projection optical system 33.

The control part 11 is connected to the light irradiation apparatus 31, the spatial light modulator 32, and the movement mechanism 22 and controls these constituent elements. In the drawing apparatus 1, the movement mechanism 22 moves the stage 21 to move an irradiation position of the light from the spatial light modulator 32 on the substrate 9. The control part 11 also controls the spatial light modulator 32 in synchronization with the movement of the irradiation position caused by the movement mechanism 22. Accordingly, a desired pattern is drawn on the photosensitive material of the substrate 9.

Figure 2:
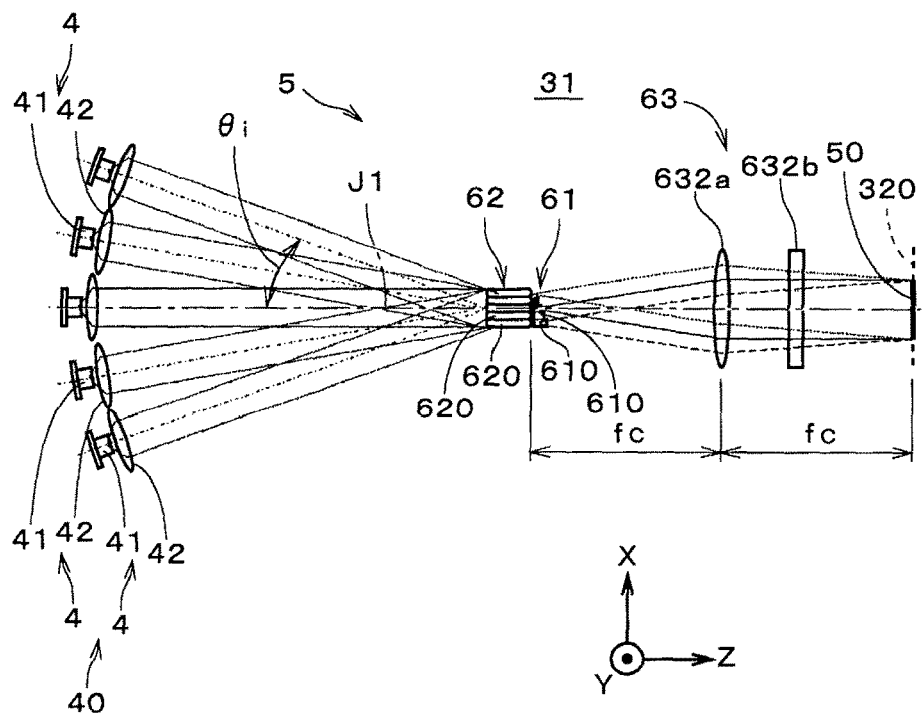
FIG. 2 illustrates a configuration of a light irradiation apparatus.
Figure 3:
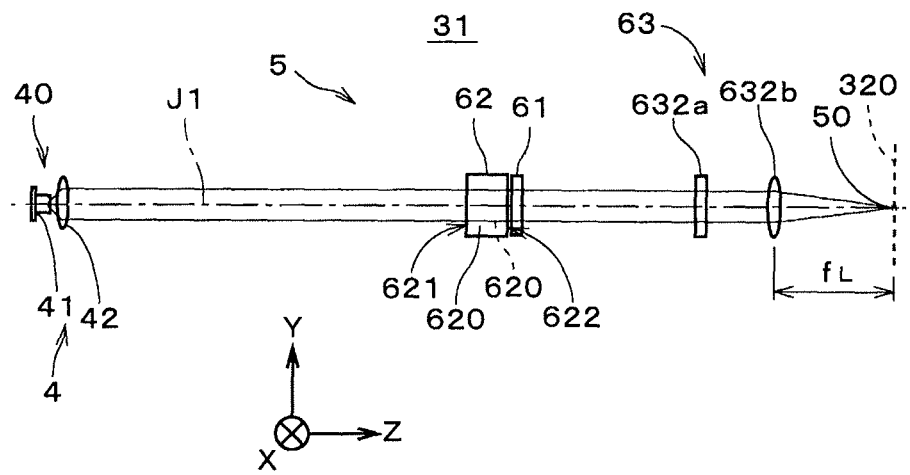
FIG. 3 illustrates the configuration of the light irradiation apparatus.

FIGS. 2 and 3 illustrate a configuration of the light irradiation apparatus 31. In FIGS. 2 and 3, a direction parallel to an optical axis J1 of an irradiation optical system 5, which will be described later, is shown as a Z direction, and directions perpendicular to the Z direction and orthogonal to each other are shown as X and Y directions (the same applies below). FIG. 2 illustrates the configuration of the light irradiation apparatus 31 when viewed in the Y direction, and FIG. 3 illustrates the configuration of the light irradiation apparatus 31 when viewed in the X direction.

The light irradiation apparatus 31 in FIGS. 2 and 3 includes a light source unit 40 and the irradiation optical system 5. The light source unit 40 includes a plurality of light source parts 4, and each light source part 4 includes a single light source 41 and a single collimating lens 42. The light sources 41 of the plurality of light source parts 4 are arrayed in approximately the X direction in a plane (hereinafter, referred to as a "light source array plane") parallel to a ZX plane. Laser light emitted from each light source 41 is collimated by the collimating lens 42 and enters the irradiation optical system 5. The light source unit 40 is provided with a mechanism (not shown) for adjusting the directions of emission of the laser light emitted from the light source parts 4. Adjusting this mechanism allows positions on the division lens part 62 in the X direction and positions on the irradiation plane 320 in the Y direction which are irradiated with the laser light emitted from the plurality of light source parts 4, to coincide with each other in the irradiation optical system 5. In this way, in the light source unit 40, the plurality of light source parts 4 arrayed in the light source array plane emit laser light toward the same position (a division lens part 62, which will be described later) in the irradiation optical system 5 from different directions along the light source array plane. With the light source unit 40 in which the plurality of light source parts 4 are attached to a support member (not shown), it is possible to, for example, efficiently cool the plurality of light sources 41.

The irradiation optical system 5 is disposed at an irradiation position of the laser light from the plurality of light source parts 4. The irradiation optical system 5 guides the laser light along the optical axis J1 to the surface of the spatial light modulator 32 that is an irradiation plane (indicated by a broken line 320 in FIGS. 2 and 3), i.e., surfaces of the plurality of grating elements. In actuality, the light irradiation apparatus 31 includes the mirror 39 as a constituent element since, as described previously, the light from the light irradiation apparatus 31 is irradiated on the spatial light modulator 32 via the mirror 39, but for convenience of illustration, the mirror 39 is omitted from FIGS. 2 and 3 (the same applies below).

The irradiation optical system 5 includes an optical path length difference generation part 61, the division lens part 62, and a light condensing part 63. In the irradiation optical system 5, the division lens part 62, the optical path length difference generation part 61, and the light condensing part 63 are arranged in this order along the optical axis J1 from the light source unit 40 toward the irradiation plane 320. The collimated laser light from the plurality of light source parts 4 enters the division lens part 62.

Figure 4:
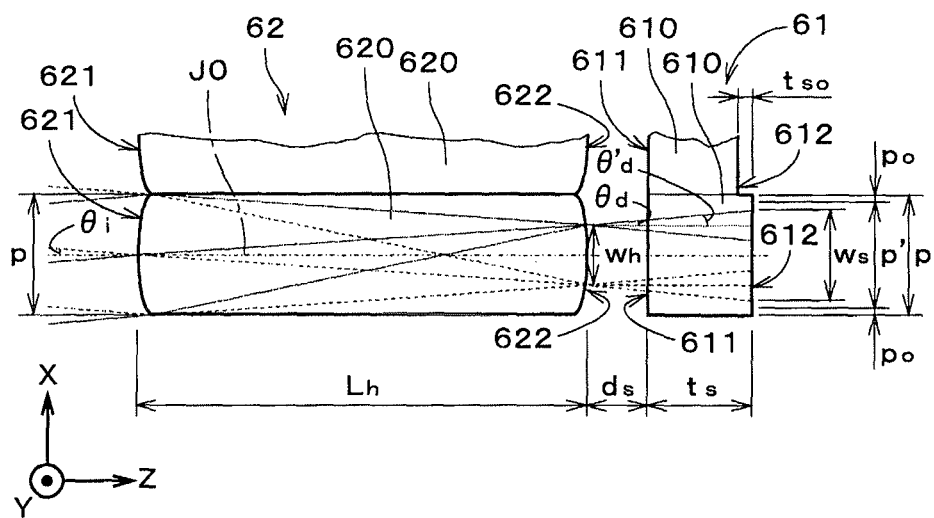
FIG. 4 illustrates part of a division lens part and an optical path length difference generation part.

FIG. 4 is a partial enlarged view of the division lens part 62 and the optical path length difference generation part 61. The division lens part 62 includes a plurality of lenses 620 (hereinafter, referred to as "element lenses 620") that are densely arrayed with a fixed pitch in a direction (here, the X direction) that is perpendicular to the optical axis J1 of the irradiation optical system 5 and along the light source array plane. Each element lens 620 is in the shape of a block that is long in the Y direction, and has a first lens surface 621 that is the side surface on the −Z side (the light source unit 40 side) and a second lens surface 622 that is the side surface on the +Z side (the optical path length difference generation part 61 side). When viewed in the Y direction, the first lens surface 621 is convex, protruding on the −Z side, and the second lens surface 622 is convex, protruding on the +Z side. When viewed in the X direction, each element lens 620 has a rectangular shape (see FIG. 3). In this way, the element lenses 620 are cylindrical lenses that have power in only the X direction, and the division lens part 62 is a so-called cylindrical lens array (or a cylindrical fly-eye lens).

The first lens surface 621 and the second lens surface 622 have symmetrical shapes relative to a plane perpendicular to the optical axis J1. The first lens surface 621 is arranged at the focal point of the second lens surface 622, and the second lens surface 622 is arranged at the focal point of the first lens surface 621. In other words, the first lens surface 621 and the second lens surface 622 have the same focal length. A length $L_h$ in the Z direction of the element lens 620 can be expressed as $(f_h \cdot n_h)$, where $f_h$ is the focal length of the first lens surface 621 and the second lens surface 622 and $n_h$ is the refractive index of the element lens 620. The parallel light incident on the element lens 620 converges to the second lens surface 622. Note that when it is necessary to avoid damage or degradation in the second lens surface 622 caused by the convergence of light, the length $L_h$ in the Z direction of the element lens 620 may be a value that is slightly shifted from $(f_h \cdot n_h)$. The plurality of element lenses 620 stacked in the X direction may be formed as an integral member, or may be separately formed and bonded together.

When viewed in the Y direction, the light incident on the division lens part 62 is divided in the X direction by the plurality of element lenses 620. At this time, the parallel light emitted from each light source part 4 enters the first lens surface 621 of each element lens 620, and images of the plurality of light sources 41 are formed in the vicinity of the second lens surface 622. These images are arranged in the array direction of the element lenses 620. Note that FIG. 4 illustrates only rays of light that enter one of the element lenses 620. The light emitted from each light source part 4 and divided by the element lenses 620 (a plurality of light fluxes) is emitted from the second lens surfaces 622 such that its principal rays are parallel to the optical axis J1 (Z direction). The light flux emitted from each element lens 620 enters the optical path length difference generation part 61 while spreading out.

The optical path length difference generation part 61 includes a plurality of transparent parts 610 that are densely arrayed with a fixed pitch in a direction (here, the X direction) that is perpendicular to the optical axis J1 and along the light source array plane. In the example in FIG. 2, the number of transparent parts 610 in the optical path length difference generation part 61 is smaller by one than the number of element lenses 620 in the division lens part 62. The array pitch of the transparent parts 610 is equal to the array pitch of the element lenses 620. Each transparent part 610 is (ideally) in the shape of a block that has surfaces perpendicular to the X, Y, and Z directions. The plurality of transparent parts 610 arrayed in a row in the X direction have the same X-direction length and the same Y-direction length, but have different lengths from each other in the Z direction, i.e., in the direction along the optical axis J1. Thus, the plurality of transparent parts 610 have different optical path lengths. In the optical path length difference generation part 61 in FIG. 2, the transparent part 610 that is closer to the +X side among the plurality of transparent parts 610 has a smaller Z-direction length. The lengths of the plurality of transparent parts 610 in the direction of the optical axis J1 do not necessarily have to sequentially increase (or decrease) in order in the X direction, and may form an arbitrary irregular shape. In the present embodiment, the plurality of transparent parts 610 in the optical path length difference generation part 61 are made of the same material and formed as an integral member. Alternatively, in the optical path length difference generation part 61, the plurality of transparent parts 610 may be separately formed and bonded together.

The division lens part 62 and the optical path length difference generation part 61 are disposed close to each other in the Z direction, and the plurality of element lenses 620, excluding the element lens 620 furthest to the +X side, and the plurality of transparent elements 610 are respectively arranged at the same positions in the X direction. Thus, the plurality of light fluxes that have passed through these element lenses 620 respectively enter the plurality of transparent elements 610. To be more specific, as illustrated in FIG. 4, the light flux emitted from the second lens surface 622 of each of these element lenses 620 enters an entrance surface 611 that is the −Z side surface of the transparent element 610 that is disposed at the same position in the X direction as the element lens 620. This light flux passes through the transparent element 610 and is emitted from an exit surface 612 that is the +Z side surface of the transparent element 610. Note that the light flux that has passed through the element lens 620 furthest to the +X side does not pass through any of the transparent parts 610.

In actuality, when the division lens part 62 and the optical path length difference generation part 61 satisfy conditions described later, the width in the X direction of the light flux emitted from the exit surface 612 of each transparent part 610 is smaller than the width in the X direction of the transparent part 610, i.e., the array pitch of the transparent part 610. This prevents or suppresses the light flux from falling on the edges of the transparent part 610 (i.e., the edges in the X direction, principally, the edges of the incidence surface 611 and the exit surface 612). Note that the optical path length difference generation part 61 may include the same number of transparent parts 610 as the number of element lenses 620 in the division lens part 62. In this case, the light that has passed through the plurality of (all) element lenses 620 will respectively enter the plurality of transparent parts 610.

As illustrated in FIGS. 2 and 3, the light flux that has passed through each transparent part 610 travels toward the light condensing part 63. The light condensing part 63 includes two cylindrical lenses 632a and 632b. The cylindrical lens 632a has power in only the X direction and is disposed at a position spaced on the +Z side by its focal length $f_C$ from the second lens surfaces 622 of the plurality of element lenses 620. In other words, the second lens surface 622 of each element lens 620 is disposed at a front focal position of the cylindrical lens 632a. The irradiation plane 320 on the optical axis J1 is disposed at a position spaced on the +Z side by the focal length $f_C$ of the cylindrical lens 632a from the cylindrical lens 632a. In other words, the irradiation plane 320 is disposed at a back focal position of the cylindrical lens 632a. The cylindrical lens 632b is disposed between the cylindrical lens 632a and the irradiation plane 320 and has power in only the Y direction. The cylindrical lens 632b is disposed at a position spaced on the −Z side by its focal length $f_L$ from the irradiation plane 320.

Figure 5:
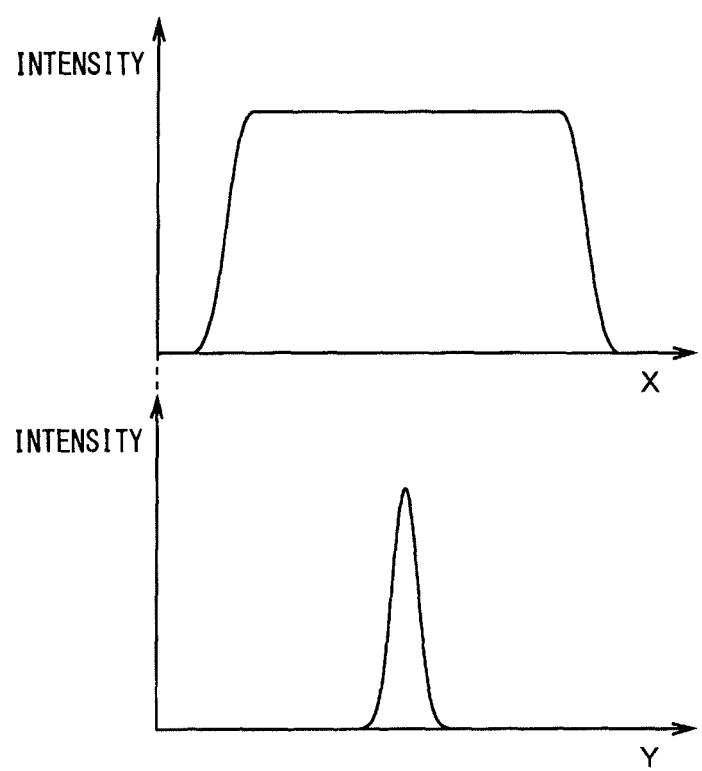
FIG. 5 illustrates a light intensity distribution in an irradiation plane.

When viewed in the Y direction as illustrated in FIG. 2, the plurality of light fluxes emitted from the plurality of element lenses 620 are collimated by the cylindrical lens 632 and superimposed on one another on the irradiation plane 320. In other words, irradiation regions 50 of the light emitted from the plurality of element lenses 620 (i.e., the plurality of light fluxes that have passed through the plurality of transparent parts 610) overlap as a whole. The irradiation regions 50 are indicated by a bold solid line in FIGS. 2 and 3 and have a fixed width in the X direction. Since, as described previously, the plurality of light fluxes emitted from the plurality of element lenses 620 pass through the different transparent parts 610, differences in optical path length are produced among the plurality of light fluxes between the division lens part 62 and the irradiation plane 320. This suppresses (or prevents) the appearance of interference fringes in the irradiation plane 320 due to the interference of the light divided by the plurality of element lenses 620. In other words, the light intensity distribution in the X direction in the irradiation plane 320 becomes uniform as illustrated in the upper section of FIG. 5. For each combination of two transparent parts 610 among the plurality of transparent parts 610, a difference in optical path length between the light fluxes that have passed through the two transparent parts 610 is preferably greater than or equal to the coherence length of the laser light emitted from the light source part 4.

When viewed in the X direction as illustrated in FIG. 3, the light incident on the division lens part 62 from the light source unit 40 remains as parallel light, passes through the division lens part 62, the optical path length difference generation part 61, and the cylindrical lens 632a, and is guided to the cylindrical lens 632b. Then, the light emitted from the cylindrical lens 632b converges to the irradiation plane 320. Thus, the irradiation region 50 of the light from each element lens 620 forms a line that extends in the X direction in the irradiation plane 320. Accordingly, linear illumination light is obtained, which is the collection of the light that has passed through the plurality of element lenses 620 and whose cross-section in the irradiation plane 320 (i.e., a light flux cross-section perpendicular to the optical axis J1; the same applies below) forms a line extending in the X direction. The intensity distribution of the linear illumination light in the Y direction is illustrated in the lower section of FIG. 5. The light irradiation apparatus 31 may use a single spherical lens to achieve the functions of the two cylindrical lenses 632a and 632b, or may use a spherical lens and a cylindrical lens in combination.

As described above, in the light irradiation apparatus 31 in FIG. 2, laser light is emitted from the plurality of light source parts 4 toward the division lens part 62. Thus, higher-intensity linear illumination light is obtained than in the case with a light irradiation apparatus that uses only a single light source part 4. In addition, since the phases of the laser light from the plurality of light source parts 4 are different from each other, the uniformity of the intensity distribution of the linear illumination light in the irradiation plane 320 can be further improved, when combined with the effect achieved by the plurality of transparent parts 610 producing differences in optical path length among the plurality of light fluxes passing through the plurality of element lenses 620. Depending on the design of the light irradiation apparatus 31, the width of bright interference fringes on the irradiation plane 320 may be increased to reduce the contrast of the linear illumination light by slightly shifting the position of the irradiation plane 320 from the back focal position of the cylindrical lens 632a (i.e., defocusing).

The condition for more reliably preventing interference fringes from appearing in the irradiation plane 320 will now be described with reference to FIG. 4. A difference $\Delta z_s$ in optical path length between two transparent parts 610 that are adjacent to each other in the X direction can be expressed by Expression 1, where $n_s$ is the refractive index of the optical path length difference generation part 61, and $t_{so}$ is the difference in Z-direction length between the two transparent parts 610. In Expression 1, the refractive index of air is assumed to be 1.

$$\Delta z_s = (n_s - 1) \cdot t_{so} \quad \text{Expression 1}$$

When the light irradiation apparatus 31 satisfies the condition that the difference $\Delta z_s$ in optical path length is greater than or equal to the coherence length $L_c$ of the laser light emitted from the light source parts 4, i.e., satisfies Expression 2, it is possible to more reliably prevent interference fringes from appearing in the irradiation plane 320 due to the interference of the light divided by the plurality of element lenses 620.

$$L_c \leq (n_s - 1) \cdot t_{so} \quad \text{Expression 2}$$

Note that the greater the difference in the optical path length of light that passes through each combination of two transparent parts 610, the lower the coherence. Thus, even if the difference in optical path length is less than the coherence length of the laser light emitted from the light source parts 4, the influence of interference fringes can be reduced to some extent when the difference in optical path length is a relatively long distance (e.g., greater than or equal to one half of the coherence length). Accordingly, the difference in optical path length for each combination of two transparent parts 610 may be appropriately set in accordance with the uniformity (contrast value) required in the intensity distribution of the linear illumination light.

Incidentally, if the light that has passed through each element lens 620 in the division lens part 62 falls on the edges of the transparent part 610 (e.g., boundaries between transparent parts 610) in the optical path length difference generation part 61, the light will scatter, reducing the uniformity of the light intensity distribution in the irradiation plane 320. In view of this, conditions for preventing the light flux emitted from each element lens 620 from falling on the edges of the transparent part 610 will be described with reference to FIG. 4.

As described previously, in the light irradiation apparatus 31, the number of transparent parts 610 in the optical path length difference generation part 61 is smaller by one than the number of element lenses 620 in the division lens part 62 (see FIG. 2). Thus, a Z-direction length $t_s$ of the transparent part 610 that has the largest Z-direction length among the plurality of transparent parts 610 can be expressed by Expression 3, where $N_s$ is the number of transparent parts 610 in the optical path length difference generation part 61 and $N_h$ is the number of element lenses 620 in the division lens part 62.

$$t_s = N_s \cdot t_{so} = (N_h - 1) \cdot t_{so} \qquad \text{Expression 3}$$

Meanwhile, the light incident on each element lens 620 from the light source part 4 that has the maximum incident angle (angle formed with respect to the Z direction when viewed in the Y direction) at which the laser light is incident on the division lens part 62 among the plurality of light source parts 4 converges to a position that is shifted in the X direction from the optical axis J0 (indicated by the dashed dotted line in FIG. 4) of the element lens 620 on the second lens surface 622 that is the exit surface of the element lens 620. More specifically, the distance in the X direction between the light condensing point of the light and the optical axis J0 on the second lens surface 622 can be expressed as $(f_h \cdot \tan \theta_i)$, where $\theta_i$ is the incident angle (maximum incident angle) of the light, and $f_h$ is the focal length of the first lens surface 621 and the second lens surface 622. Since, in the light irradiation apparatus 31 in FIG. 2, the plurality of light source parts 4 are arranged to be symmetric with respect to a plane that is perpendicular to the X direction and includes the optical axis J1 of the irradiation optical system 5, light condensing points that are separated by the same distance from the optical axis J0 of the element lens 620 are formed on both +X and −X sides of the optical axis J0. Thus, an X-direction width $w_h$, on the second lens surface 622, of the light incident on each element lens 620 from all of the light source parts 4 can be expressed by Expression 4.

$$w_h = 2 f_h \cdot \tan \theta_i \qquad \text{Expression 4}$$

The angle (half angle) $\theta_d$ of divergence of the light that passes through the above light condensing points does not depend on the incident angle of the light from the light source parts 4 and can be expressed by Expression 5, where p is the array pitch of the element lenses 620 (and the transparent parts 610).

$$\theta_d = \tan^{-1}(p/2 f_h) \qquad \text{Expression 5}$$

The angle (half angle) $\theta'_d$ of divergence of the above light inside the optical path length difference generation part 61 can be expressed by Expression 6.

$$\theta'_d = \sin^{-1}(\sin \theta_d / n_s) \qquad \text{Expression 6}$$

Accordingly, an X-direction width $w_s$ of the light flux on the exit surface 612 of the transparent part 610 that has the largest Z-direction length can be expressed by Expression 7, where $d_s$ is the Z-direction width of a space between the second lens surface 622 of the division lens part 62 and the entrance surface 611 of the optical path length difference generation part 61.

$$w_s = w_h + 2(d_s \cdot \tan \theta_d + t_s \cdot \tan \theta'_d) \qquad \text{Expression 7}$$

In actuality, there are cases where the transparent parts 610 are subjected to so-called chamfering in which the corners of the transparent parts 610 are trimmed. In such cases, non-effective regions are present at and in the vicinity of the edges of the exit surfaces 612 of the transparent parts 610. The width in the X direction of such a non-effective region is, for example, greater than zero and less than or equal to 100 μm. An X-direction width p' of an effective region of the exit surface 612 of the transparent part 610 can be expressed by Expression 8, where $p_o$ is a predetermined X-direction width of the non-effective region.

$$p' = p - 2 p_o \qquad \text{Expression 8}$$

Accordingly, the condition for allowing the light flux that has passed through each element lens 620 of the division lens part 62 to pass through only the effective region of the exit surface 612 of the transparent part 610 while preventing the light flux from scattering in the vicinity of the edges can be expressed by Expression 9.

$$w_s \leq p' \qquad \text{Expression 9}$$

The light irradiation apparatus 31 that satisfies Expression 9 can prevent the light incident on the transparent parts 610 from falling on the edges of the transparent parts 610 and can more reliably ensure the uniformity of the intensity distribution of the light irradiated to the irradiation plane 320 by the light irradiation apparatus 31. The light irradiation apparatus 31 can also avoid loss in the amount of light due to scattering of light at the edges of the transparent parts 610. Since, as described previously, the X-direction width $p_o$ of the non-effective region is greater than zero, it can be said in the light irradiation apparatus 31 satisfying Expression 9 that, with respect to the array direction of the plurality of transparent parts 610, the width of the light emitted from the exit surface 612 of each of the plurality of transparent parts 610 is smaller than the pitch of the plurality of transparent parts 610.

As can be clearly seen from Expressions 7 and 9, the smaller the maximum length $t_s$ of the transparent parts 610, the easier it is to satisfy the condition expressed by Expression 9. As previously described, it is possible for the optical path length difference generation part 61 to include the same number of transparent parts 610 as the number of element lenses 620 in the division lens part 62. However, from the viewpoint of easily satisfying the condition expressed by Expression 9, the number of transparent parts 610 is preferably smaller by one than the number of element lenses 620 because the maximum length $t_s$ of the transparent parts 610 depends on the number of transparent parts 610.

Figure 6:
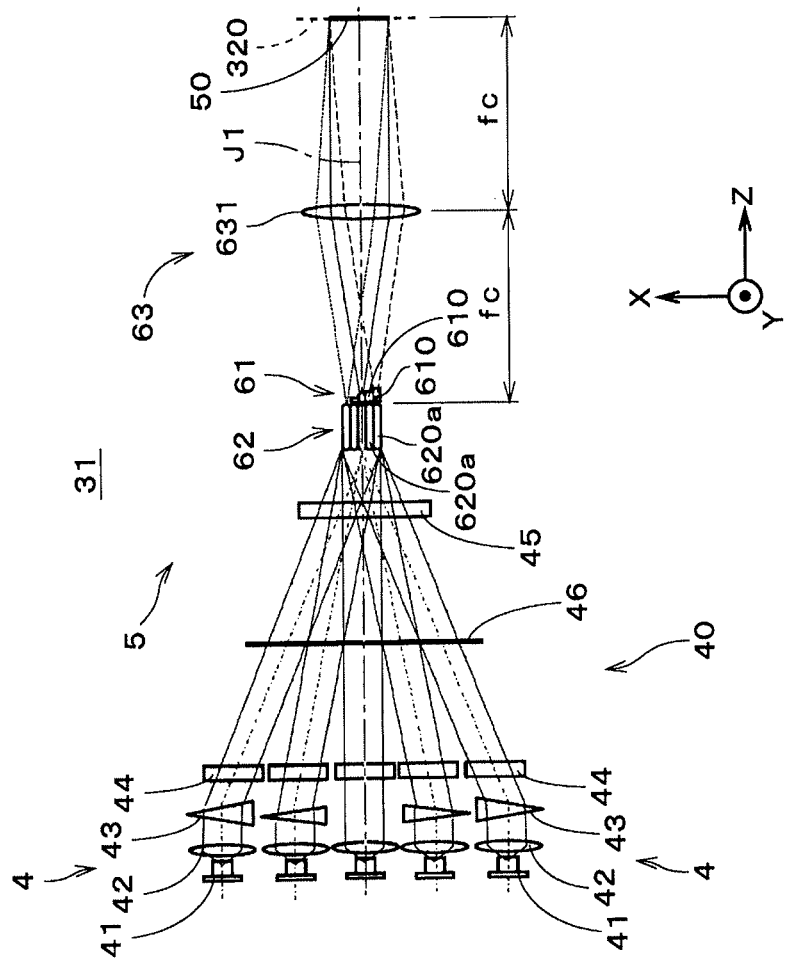
FIG. 6 illustrates another example of the light irradiation apparatus.
Figure 7:
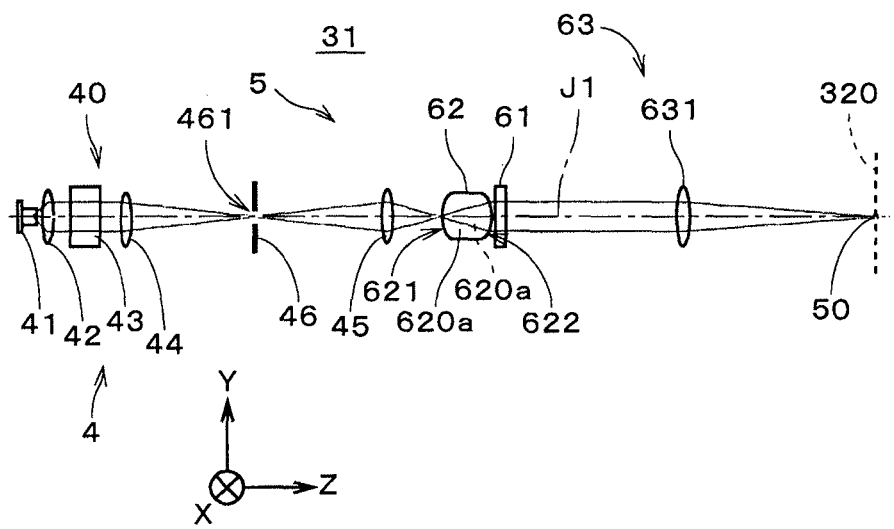
FIG. 7 illustrates another example of the light irradiation apparatus.

FIGS. 6 and 7 illustrate another example of the light irradiation apparatus 31. FIG. 6 illustrates a configuration of the light irradiation apparatus 31 when viewed in the Y direction, and FIG. 7 illustrates the configuration of the light irradiation apparatus 31 when viewed in the X direction.

In the light irradiation apparatus 31 in FIG. 6, each light source part 4 of the light source unit 40 includes a prism 43, a cylindrical lens 44, and a cylindrical lens 45 in addition to the light source 41 and the collimating lens 42. The light sources 41 of the plurality of light source parts 4 are arrayed in the X direction in a light source array plane that is parallel to a ZX plane. The laser light emitted from each light source 41 is collimated by the collimating lens 42, is deflected by the prism 43, and travels toward the division lens part 62 in the irradiation optical system 5. In the light source unit 40, the prisms 43 have different vertical angles depending on the X-direction positions of the plurality of light sources 41 so that the plurality of light source parts 4 can emit laser light toward the same position (division lens part 62) in the irradiation optical system 5 from different directions along the light source array plane. Note that the prism 43 is omitted from the light source part 4 that is located in the center in the X direction.

As illustrated in FIGS. 6 and 7, the cylindrical lenses 44 and 45 have power in only the Y direction. The cylindrical lenses 44 and 45 are provided between the prisms 43 and the division lens part 62. The cylindrical lens 44 is provided for each light source part 4, whereas the cylindrical lens 45 is shared among the plurality of light source parts 4. A spatial filter 46 is provided between the cylindrical lenses 44 and the cylindrical lens 45. The spatial filter 46 is a slit plate and has a slit 461 that is long in the X direction. When viewed in the X direction as illustrated in FIG. 7, the laser light that has passed through the cylindrical lenses 44 converges to the vicinity of the slit 461 of the spatial filter 46, and light that has passed through the slit 461 enters the cylindrical lens 45. Light that has passed through the cylindrical lens 45 enters the −Z-side surface of the division lens part 62.

The division lens part 62 illustrated in FIGS. 6 and 7 differs from the division lens part 62 illustrated in FIGS. 2 and 3 in that the first lens surface 621 and the second lens surface 622 of each element lens 620a are both part of spherical surfaces. In this division lens part 62 as well, the first lens surfaces 621 of the element lenses 620a are disposed at the focal points of the second lens surfaces 622, and the second lens surfaces 622 are disposed at the focal points of the first lens surfaces 621. In other words, the first lens surface 621 and the second lens surface 622 have the same focal length. The configuration and arrangement of the optical path length difference generation part 61 is the same as those of the optical path length difference generation part 61 in FIG. 2.

When viewed in the Y direction as illustrated in FIG. 6, the light incident on the division lens part 62 is divided in the X direction by a plurality of element lenses 620a. A plurality of light fluxes that have passed through the plurality of element lenses 620a, excluding the element lens 620a disposed furthest to the +X side, respectively enter the plurality of transparent parts 610 of the optical path length difference generation part 61. The light that has passed through the plurality of transparent parts 610 and the light that has passed through the element lens 620a disposed furthest to the +X side enter the condensing lens part 63. The condensing lens part 63 includes a condensing lens 631. The condensing lens 631 is disposed at a position spaced along the optical axis J1 by its focal length $f_c$ from the second lens surfaces 622 (see FIG. 7) of the plurality of element lenses 620a. In other words, the second lens surface 622 of each element lens 620a is disposed at a front focal surface of the condensing lens 631. The irradiation plane 320 on the optical axis J1 is disposed at a position spaced along the optical axis J1 by the focal length $f_c$ of the condensing lens 631 from the condensing lens 631. In other words, the irradiation plane 320 coincides with a back focal surface of the condensing lens 631. The plurality of light fluxes emitted from the plurality of element lenses 620a are collimated by the condensing lens 631 and superimposed on one another on the back focal surface of the condensing lens 631. In other words, irradiation regions 50 of the light (plurality of light fluxes) from the plurality of element lenses 620a overlap as a whole.

When viewed in the X direction as illustrated in FIG. 7, the light emitted from the cylindrical lens 45 of the light source unit 40 converges to the first lens surfaces 621 of the plurality of element lenses 620a and is emitted as parallel light that is parallel to the optical axis J1 from the second lens surfaces 622. The light from the plurality of element lenses 620a is caused by the condensing lens 631 to converge to the back focal surface (irradiation plane 320) of the condensing lens 631. Accordingly, linear illumination light whose cross-section in the irradiation plane 320 forms a line extending in the X direction is obtained.

As described above, the light irradiation apparatus 31 in FIG. 6 can also obtain high-intensity linear illumination light by emitting laser light from the plurality of light source parts 4 toward the division lens part 62. In addition, the use of the plurality of light source parts 4 can improve the uniformity of the intensity distribution of the linear illumination light in the irradiation plane 320, when combined with the effect achieved by the plurality of transparent parts 610 producing differences in optical path length among a plurality of light fluxes passing through the plurality of element lenses 620a. Moreover, when the light irradiation apparatus 31 in FIG. 6 satisfies the condition expressed by Expression 9, with respect to the array direction of the plurality of transparent parts 610, the width of the light emitted from the exit surface 612 of each of the plurality of transparent parts 610 is smaller than the pitch of the plurality of transparent parts 610. This prevents the light incident on the transparent parts 610 from falling on the edges of the transparent parts 610, thus more reliably ensuring the uniformity of the intensity distribution of the light irradiated to the irradiation plane 320 by the light irradiation apparatus 31.

Figure 8A:
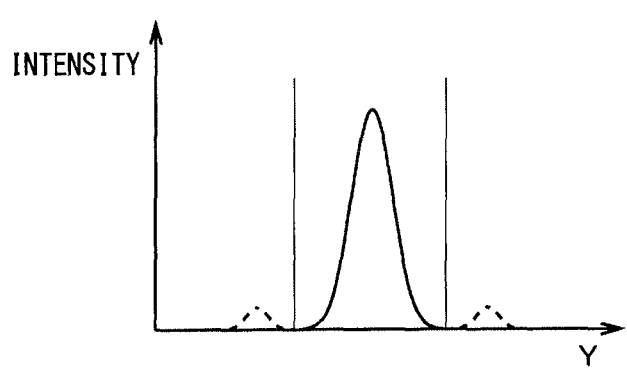
FIG. 8A illustrates a light intensity distribution in the irradiation plane.

FIG. 8A illustrates the light intensity distribution in the Y direction in the irradiation plane 320. Assuming the case of a light source unit of a comparative example that omits the spatial filter 46, depending on the type or condition of a light source, unnecessary light intensity peaks such as side lobes may appear adjacent to light intensity peaks necessary for the linear illumination light in the light intensity distribution in the Y direction in the irradiation plane. Such unnecessary light intensity peaks are indicated by broken lines in FIG. 8A. In contract, the light source unit 40 in FIG. 3 that is provided with the spatial filter 46 can eliminate unnecessary light intensity peaks (i.e., can form the light irradiated to the irradiation plane 320) and accordingly can obtain desirable linear illumination light.

Figure 8B:
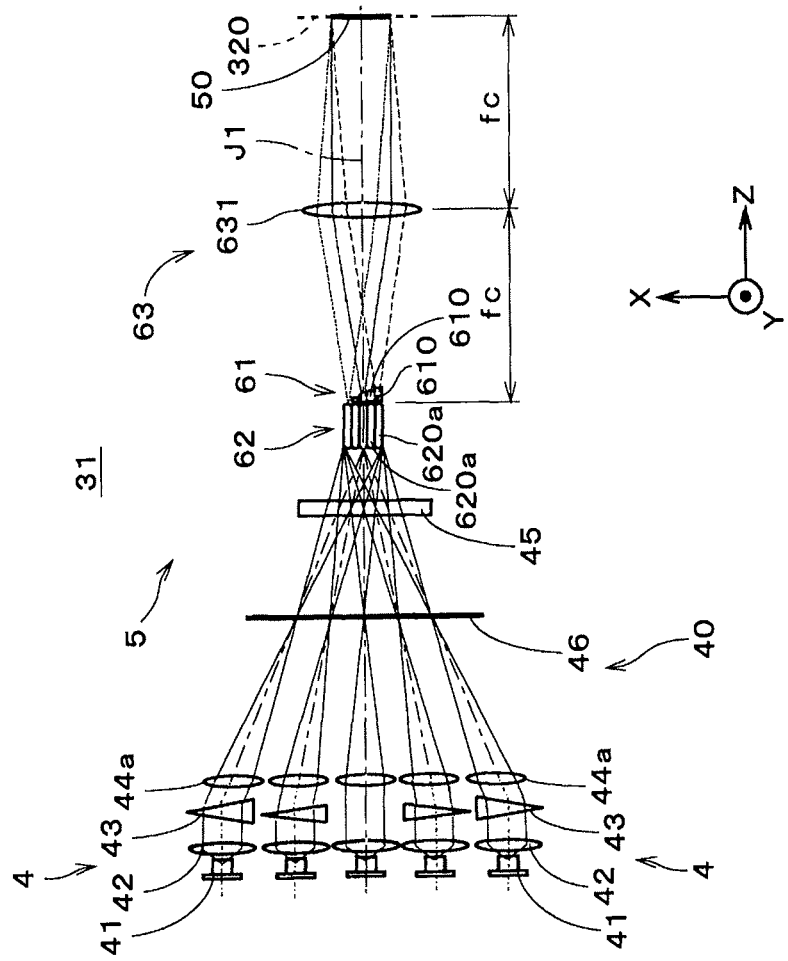
FIG. 8B illustrates another example of the light irradiation apparatus.

With the light source unit 40 in FIG. 6 in which the plurality of light source parts 4 are attached to a support member (not shown), it is possible to, for example, efficiently cool the plurality of light sources 41. In addition, the use of the prisms 43 allows the light sources 41 and the collimating lenses 42 to be disposed such that the optical axes of the light sources 41 and the collimating lens 42 are parallel to the Z direction in all of the light source parts 4. Consequently, the support member can be produced more easily than in the case with the light source unit 40 in FIG. 2 in which the light sources 41 and the collimating lenses 42 are disposed such that the optical axes of the light sources 41 and the collimating lenses 42 are inclined at various angles with respect to the Z direction in the plurality of light source parts 4. Note that the collimation of light in the X direction is not essential, and the light from the light source parts 4 may enter the division lens part 62 while slightly diverging or converging in the X direction. FIG. 8B illustrates a light irradiation apparatus 31 in which the cylindrical lenses 44 in FIG. 6 are replaced by spherical lenses 44a. The appearance of the light irradiation apparatus 31 in FIG. 8B as seen in the X direction is the same as in FIG. 7.

Incidentally, in the division lens part 62 in FIG. 3 that uses cylindrical lenses as the element lenses 620, the degree of parallelism (wedge component) of the first lens surface 621 and the second lens surface 622 when viewed in the X direction may greatly vary among the plurality of element lenses 620, depending on the accuracy of the production of the division lens part 62. In this case, there are cases where the plurality of light fluxes that have passed through the plurality of element lenses 620 enter the condensing lens part 63 at inclined angles in different directions with respect to the optical axis J1, and the positions at which the irradiation regions 50 are formed in the irradiation plane 320 are shifted from each other in the Y direction. In contrast, the division lens part 62 in FIG. 7 that uses spherical lenses, which are easily formed with high precision, as the element lenses 620a allows the positions at which the irradiation regions 50 are formed in the irradiation plane 320 by the light fluxes that have passed through the plurality of element lenses 620a to approximately coincide with one another in the Y direction. The above-described techniques respectively using the spatial filter 46, the prisms 43, and the element lenses 620a may independently be employed in other light irradiation apparatuses 31 (and a light irradiation apparatus 31a described below).

Figure 9:
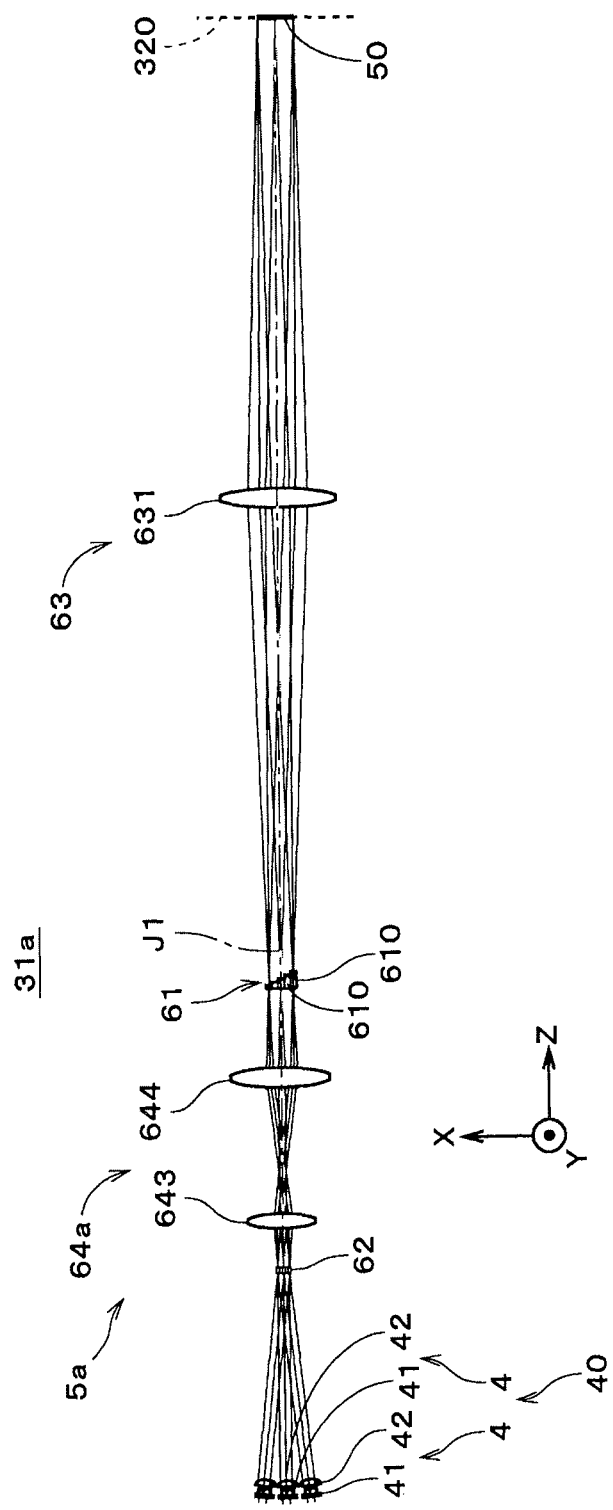
FIG. 9 illustrates a configuration of a light irradiation apparatus according to a second embodiment.
Figure 10:
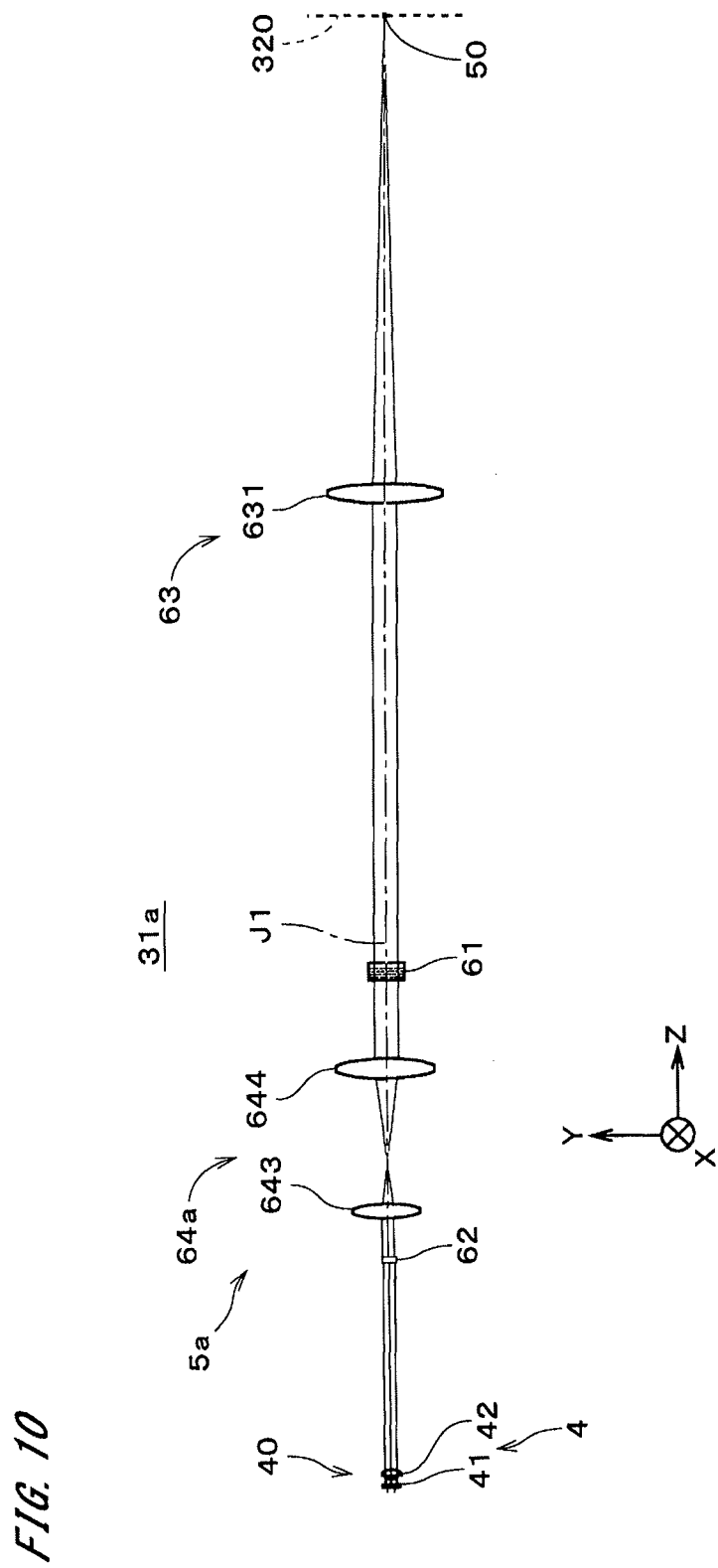
FIG. 10 illustrates the configuration of the light irradiation apparatus according to the second embodiment.

FIGS. 9 and 10 illustrate a configuration of the light irradiation apparatus 31a according to a second embodiment of the present invention. FIG. 9 illustrates the configuration of the light irradiation apparatus 31a when viewed in the Y direction, and FIG. 10 illustrates the configuration of the light irradiation apparatus 31a when viewed in the X direction.

The light irradiation apparatus 31a illustrated in FIGS. 9 and 10 includes a light source unit 40 and an irradiation optical system 5a. The light source unit 40 has the same configuration as that of the light source unit 40 in FIG. 2. Thus, in the light source unit 40, a plurality of light source parts 4 emit laser light toward the same position (a division lens part 62, which will be described below) in the irradiation optical system 5a from different directions along a light source array plane.

Figure 11:
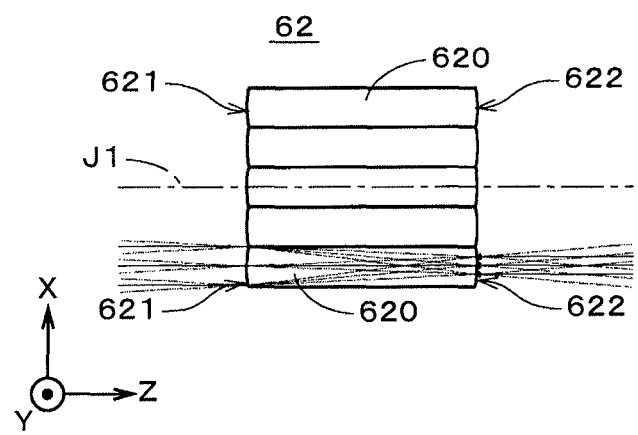
FIG. 11 illustrates the vicinity of the division lens part.

The irradiation optical system 5a includes an optical path length difference generation part 61, the division lens part 62, a condensing lens part 63, and an intermediate magnification part 64a. In the irradiation optical system 5a, the division lens part 62, the intermediate magnification part 64a, the optical path length difference generation part 61, and the condensing lens part 63 are arranged in this order from the light source unit 40 toward an irradiation plane 320 along an optical axis J1. Collimated laser light from the plurality of light source parts 4 enters the division lens part 62. As illustrated in FIG. 11, in the division lens part 62, a plurality of element lenses 620 are arrayed in the X direction, which is perpendicular to the optical axis J1 of the irradiation optical system 5a and along the light source array plane.

When viewed in the Y direction, the light incident on the division lens part 62 is divided in the X direction by the plurality of element lenses 620. At this time, parallel light from each light source part 4 enters the first lens surface 621 of each element lens 620, and images of a plurality of light sources 41 are formed in the vicinity of the second lens surfaces 622. These images are arranged in the array direction of the element lenses 620. Note that FIG. 11 illustrates only light rays that are incident on one of the element lenses 620.

The light (plurality of light fluxes) divided by the plurality of element lenses 620 is emitted from the second lens surfaces 622 such that its principal rays are parallel to the optical axis J1. The light flux emitted from each element lens 620 enters a lens 643 of the intermediate magnification part 64a in FIG. 9 while spreading out, and enters the optical path length difference generation part 61 through the lens 643 and 644. In the optical path length difference generation part 61, a plurality of transparent parts 610 are arrayed in the X direction, which is perpendicular to the optical axis J1 of the irradiation optical system 5a and along the light source array plane. The array pitch of the transparent parts 610 is greater than the array pitch of the element lenses 620.

The intermediate magnification part 64a constitutes an afocal optical system, or more specifically, a double telecentric optical system, and causes the light that is incident such that its principal rays are parallel to the optical axis J1 to enter the optical path length difference generation part 61 such that its principal rays are parallel to the optical axis J1. At this time, the intermediate magnification part 64a enlarges and forms images of second lens surfaces 622 that are exit surfaces of the plurality of element lenses 620 (to be more specific, images of the plurality of light sources 41 on the second lens surfaces 622) inside or in the vicinity of the optical path length difference generation part 61.

To be more specific, the enlargement ratio of the intermediate magnification part 64a is equal to a value obtained by dividing the array pitch of the transparent parts 610 in the optical path length difference generation part 61 by the array pitch of the element lenses 620 in the division lens part 62. Thus, the light (plurality of light fluxes) that has passed through the plurality of element lenses 620 respectively enters the plurality of transparent parts 610 through the intermediate magnification part 64a that constitutes an enlarging optical system. At this time, the images of the second lens surfaces 622 of the plurality of element lenses 620 are respectively formed inside or in the vicinity of the plurality of transparent parts 610. Also, the angle of divergence of the light flux emitted from each element lens 620 within the transparent part 610 becomes smaller according to the enlargement ratio than the angle of divergence thereof in the vicinity of the second lens surface 622 of the element lens 620. This consequently reduces the likelihood of the light flux falling on the edges of the transparent part 610 (e.g., boundaries between adjacent transparent parts 610). The light flux that has passed through each transparent part 610 travels toward the condensing lens part 63. The plurality of light fluxes emitted from the plurality of transparent parts 610 are collimated by a condensing lens 631 of the condensing lens part 63 and superimposed on one another on the irradiation plane 320. In other words, irradiation regions 50 of the light (plurality of light fluxes) from the plurality of transparent parts 610 overlap as a whole.

When viewed in the X direction as illustrated in FIG. 10, the light incident on the optical path length difference generation part 61 from the light source unit 40 through the division lens part 62 and the intermediate magnification part 64a remains as parallel light, passes through the plurality of transparent parts 610, and is guided to the condensing lens 631. Then, light emitted from the condensing lens 631 converges to the irradiation plane 320. Accordingly, the irradiation region 50 of the light from each element lens 620 (transparent part 610) forms a line that extends in the array direction in the irradiation plane 320. In other words, the light with which the irradiation plane 320 is irradiated by the light irradiation apparatus 31a has a cross-section that forms a line extending in the X direction, and linear illumination light is obtained.

While the light irradiation apparatus 31a uses a spherical lens as the condensing lens 631, for example, linear illumination light having a desired width in the Y direction in the irradiation plane 320 may be obtained by adding a cylindrical lens that has power in only the Y direction to the condensing lens part 63. Note that when the light sources 41 are high-power semiconductor lasers and laser light emitted from the light sources 41 is in multimode in one direction, the direction in which the laser light is in single mode preferably coincides with the direction (Y direction) perpendicular to the array direction of the element lenses 620 in the division lens part 62. This prevents an increase in the Y-direction width of linear illumination light in the irradiation plane 320.

Incidentally, in the light irradiation apparatus 31 illustrated in FIGS. 2 and 6, the array pitch of the transparent parts 610 in the optical path length difference generation part 61 needs to be equal to the array pitch of the element lenses 620 in the division lens part 62. Although a small-size division lens part can be easily produced with high precision by photolithography, it is difficult to use photolithography to produce an optical path length difference generation part in which the plurality of transparent parts have different lengths in the direction of the optical axis. It is thus necessary to produce the optical path length difference generation part through complex operations such as machining.

In contrast, in the light irradiation apparatus 31a in FIG. 9, the intermediate magnification part 64a constituting an enlarging optical system is disposed between the division lens part 62 and the optical path length difference generation part 61. In this case, with respect to the array direction of the transparent parts 610 (X direction in FIG. 9), the size of the optical path length difference generation part 61 can be made greater than the size of the division lens part 62, and accordingly it is possible to easily produce the optical path length difference generation part 61. Note that the light irradiation apparatus 31 shown in FIGS. 2 and 6 can adopt a simplified configuration by omitting the intermediate magnification part 64a, and therefore downsizing of the light irradiation apparatus 31 and so on can easily be achieved.

In the light irradiation apparatus 31a, laser light is emitted from the plurality of light source parts 4 toward the division lens part 62. Thus, higher-intensity illumination light can be obtained than in the case of a light irradiation apparatus that uses only a single light source part 4. In addition, since the phases of the laser light from the plurality of light source parts 4 are different from each other, the uniformity of the intensity distribution of the linear illumination light in the irradiation plane 320 can be further improved, when coupled with the effect achieved by the plurality of transparent parts 610 producing differences in optical path length among the plurality of light fluxes passing through the plurality of element lenses 620.

In the light irradiation apparatus 31a, the intermediate magnification part 64a forms the images of the exit surfaces of the plurality of element lenses 620 inside or in the vicinity of the plurality of transparent parts 610, and along with the enlargement of these images, the angle of divergence of the light flux emitted from each element lens 620 in the transparent part 610 becomes smaller than the angle of divergence thereof in the element lens 620. This consequently easily reduces the likelihood of the light flux falling on the edges of the transparent part 610, and more reliably ensures the uniformity of the intensity distribution of the light irradiated to the irradiation plane 320 by the light irradiation apparatus 31a.

Figure 12:
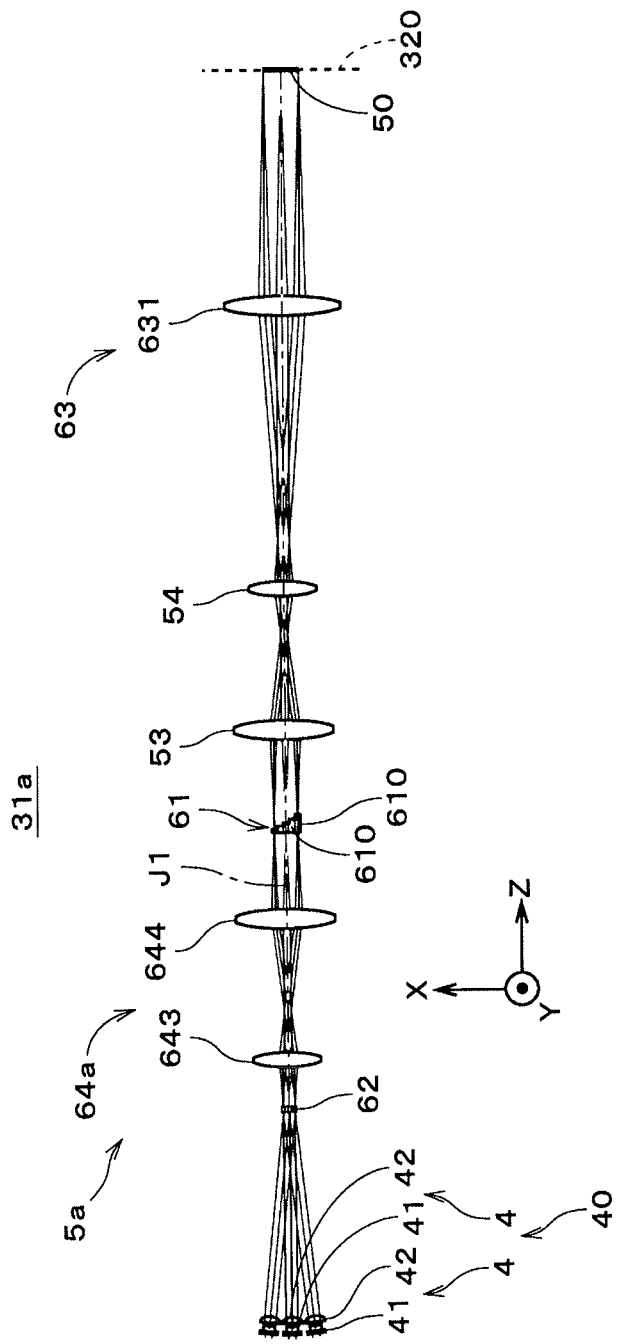
FIG. 12 illustrates another example of the light irradiation apparatus.
Figure 13:
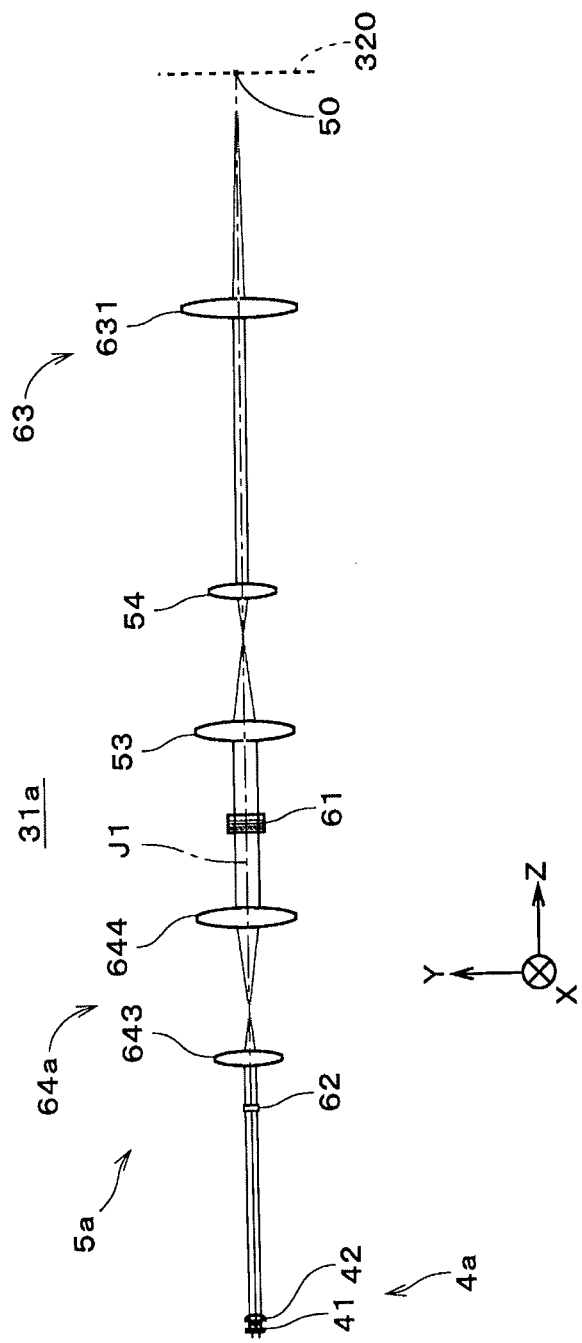
FIG. 13 illustrates another example of the light irradiation apparatus.

FIGS. 12 and 13 illustrate another example of the light irradiation apparatus 31a. FIG. 12 illustrates a configuration of the light irradiation apparatus 31a when viewed in the Y direction, and FIG. 13 illustrates the configuration of the light irradiation apparatus 31a when viewed in the X direction. The light irradiation apparatus 31a illustrated in FIGS. 12 and 13 differs from the light irradiation apparatus 31a in FIGS. 9 and 10 in that lenses 53 and 54 are additionally provided between the optical path length difference generation part 61 and the condensing lens part 63. The other constituent elements are the same as those of the light irradiation apparatus 31a in FIGS. 9 and 10, and constituent elements that are the same as in FIGS. 9 and 10 are given the same reference numerals.

The lenses 53 and 54 constitute a reducing optical system (e.g., a double telecentric optical system) and reduce and relay the images of the second lens surfaces 622 of the plurality of element lenses 620 (see FIG. 11) (to be more specific, images of the plurality of light sources 41 on the second lens surfaces 622) inside or in the vicinity of the optical path length difference generation part 61. Light emitted from the lens 54 enters the condensing lens 631 of the condensing lens part 63, and linear irradiation regions 50 are formed in the irradiation plane 320.

Since, as described previously, the angle of divergence of the light flux emitted from each element lens 620 in the transparent part 610 is relatively small, the light irradiation apparatus 31a can easily reduce the likelihood of the light flux falling on the edges of the transparent part 610. In this case, in order to obtain linear illumination light having a certain degree of X-direction length in the irradiation plane 320, the light irradiation apparatus 31a in FIG. 9 needs to have the condensing lens 631 having a long focal length, which increases the overall length of the irradiation optical system 5a in the Z direction. In contrast, the light irradiation apparatus 31a in FIG. 12 includes the lenses 53 and 54, which constitute a reducing optical system, between the optical path length difference generation part 61 and the condensing lens part 63, thus enabling the overall length of the irradiation optical system 5a to be relatively shortened and the light irradiation apparatus 31a to be reduced in size.

Figure 14:
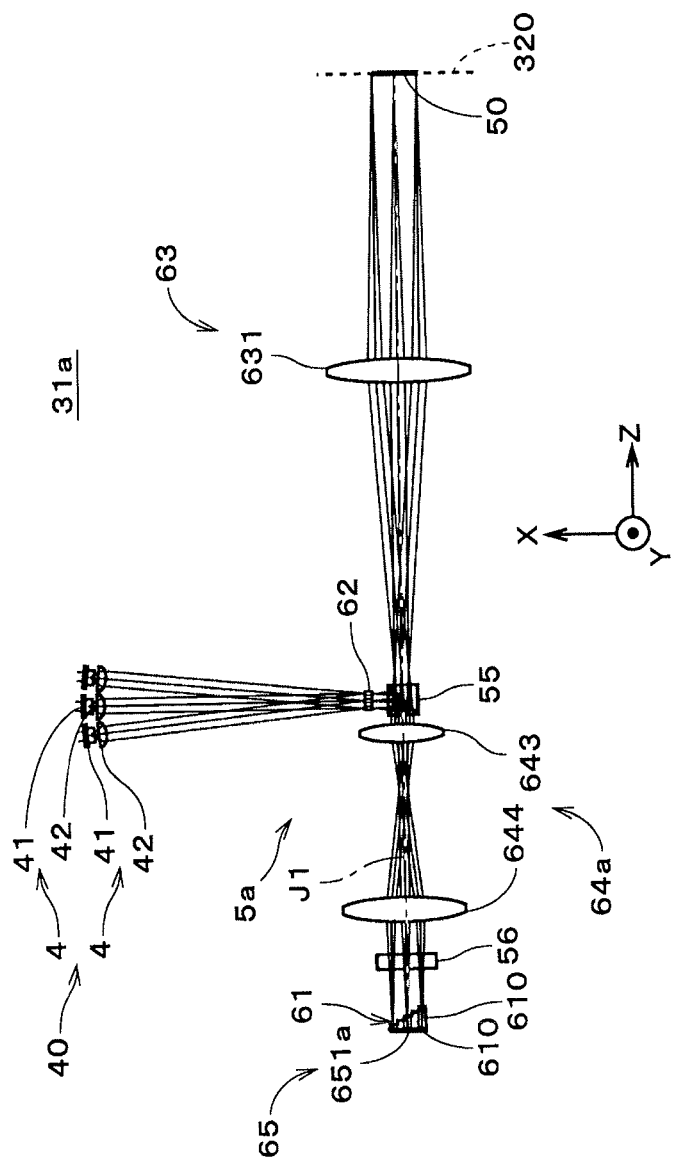
FIG. 14 illustrates another example of the light irradiation apparatus.
Figure 15:
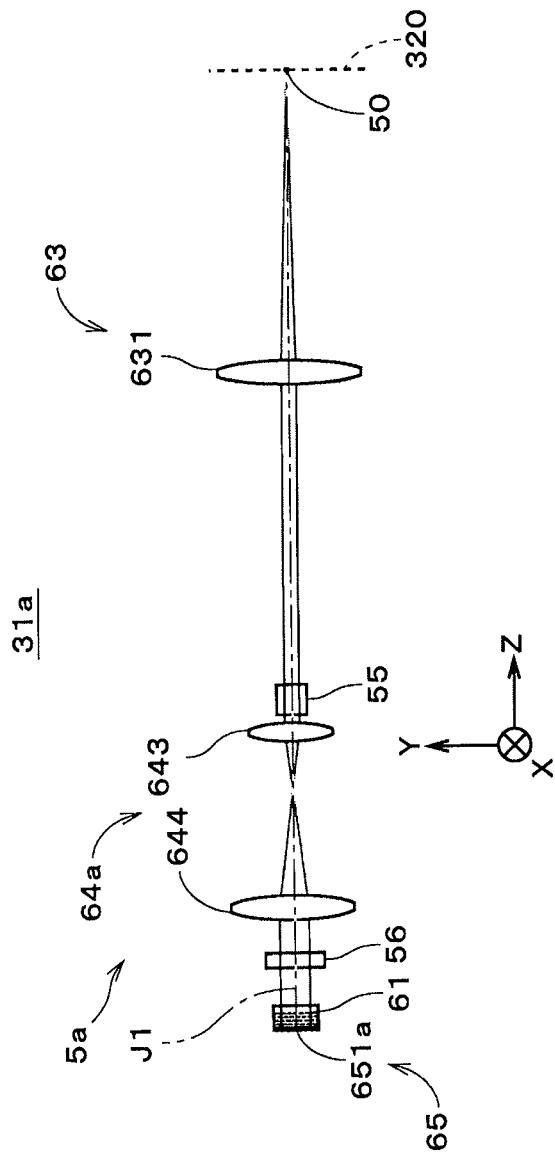
FIG. 15 illustrates another example of the light irradiation apparatus.

FIGS. 14 and 15 illustrate another example of the light irradiation apparatus 31a. FIG. 14 illustrates a configuration of the light irradiation apparatus 31a when viewed in the Y direction, and FIG. 15 illustrates the configuration of the light irradiation apparatus 31a when viewed in the X direction. The light irradiation apparatus 31a illustrated in FIGS. 14 and 15 differs from the light irradiation apparatus 31a in FIGS. 9 and 10 in that a polarization beam splitter 55, a quarter-wave plate 56, and a reflecting part 65 are additionally provided. The other constituent elements are the same as those of the light irradiation apparatus 31a in FIGS. 9 and 10, and constituent elements that are the same as in FIGS. 9 and 10 are given the same reference numerals.

In the light irradiation apparatus 31a in FIG. 14, the reflecting part 65, the optical path length difference generation part 61, the quarter-wave plate 56, the lenses 644 and 643 of the intermediate magnification part 64a, the polarization beam splitter 55, and the condensing lens part 63 are arranged in this order from the −Z side toward the +Z direction. The light source unit 40 is disposed on the +X side of the polarization beam splitter 55, and the division lens part 62 is disposed between the light source unit 40 and the polarization beam splitter 55. In the light source unit 40, laser light is emitted from the plurality of light source parts 4, arrayed in approximately the Z direction, toward the division lens part 62 in directions that are parallel to the light source array plane and different from one another.

In the division lens part 62, the plurality of element lenses 620 (see FIG. 11) are arrayed in the Z direction, which is perpendicular to the optical axis between the light source unit 40 and the polarization beam splitter 55 and along the light source array plane, and light incident on the division lens part 62 is divided in the Z direction. The light that has passed through the division lens part 62 enters the polarization beam splitter 55 such that its principal rays are parallel to the X direction. The polarization beam splitter 55 is configured to separate p-polarized light components and s-polarized light components. Most of the light incident on the polarization beam splitter 55 from the light source unit 40 through the division lens part 62 consists of s-polarized light components, and this light is reflected on the polarization beam splitter 55 and travels toward the lens 643 of the intermediate magnification part 64*a*. At this time, the array direction of the plurality of light fluxes emitted from the plurality of element lenses 620 is changed to the X direction. In other words, the principal rays of the light traveling from the polarization beam splitter 55 toward the intermediate magnification part 64*a* become parallel to the Z direction.

The intermediate magnification part 64*a*, which constitutes a double telecentric optical system, causes the light that is incident such that its principal rays are parallel to the optical axis J1 (Z direction) to enter the optical path length difference generation part 61 such that its principal rays are parallel to the optical axis J1. In actuality, the light (plurality of light fluxes) that has passed through the plurality of element lenses 620 respectively enters the plurality of transparent parts 610 arrayed in the X direction through the polarization beam splitter 55, the intermediate magnification part 64*a*, and the quarter-wave plate 56, and images of the second lens surfaces 622 of the plurality of element lenses 620 (images of the light sources 41) are enlarged and formed respectively inside or in the vicinity of the plurality of transparent parts 610 in the optical path length difference generation part 61. In this way, the array direction of the element lenses 620 in the division lens part 62 and the array direction of the transparent parts 610 in the optical path length difference generation part 61 correspond to each other via the polarization beam splitter 55.

The reflecting part 65 includes a reflection film 651*a* that is formed by coating on the −Z-side surface of the optical path length difference generation part 61. The light flux incident on the entrance surface 611 (see FIG. 4), which is the +Z-side surface of each transparent part 610, is reflected by the reflection film 651*a* on the exit surface 612, which is the −Z-side surface, and is emitted from the entrance surface 611. In other words, the light flux incident on the entrance surface 611 of each transparent part 610 travels back and forth in the Z direction inside the transparent part 610 and is emitted in the +Z direction from the entrance surface 611. The reflection film 651*a* on the exit surface 612 practically serves as a film that causes the light emitted from the plurality of exit surfaces 612 of the plurality of transparent parts 610 to return (i.e., rotate the travel direction by 180 degrees) and enter the plurality of exit surfaces 612. Note that the images of the second lens surfaces 622 of the element lenses 620 are preferably formed in the vicinity of the exit surfaces 612 of the transparent parts 610 (in the vicinity of the reflection film 651*a*).

The light emitted in the +Z direction from the optical path length difference generation part 61 enters the intermediate magnification part 64*a* through the quarter-wave plate 56. The intermediate magnification part 64*a* reduces and relays the images of the exit surfaces of the plurality of element lenses 620 inside or in the vicinity of the optical path length difference generation part 61. The light emitted from the lens 643 enters the polarization beam splitter 55. The light incident on the polarization beam splitter 55 from the intermediate magnification part 64*a* becomes p-polarized light components after having passed through the quarter-wave plate 56 two times during the travel between the polarization beam splitter 55 and the reflecting part 65, and this light passes through the polarization beam splitter 55 and enters the condensing lens 631. Then, the condensing lens 631 superimposes the irradiation regions 50 of the light from the plurality of element lenses 620 on one another on the irradiation plane 320.

As described above, in the light irradiation apparatus 31*a* in FIG. 14, the intermediate magnification part 64*a* forms the enlarged images of the exit surfaces of the plurality of element lenses 620 inside or in the vicinity of the plurality of transparent parts 610 on the forward path during the forward and backward travel of the light between the polarization beam splitter 55 and the reflecting part 65. Thus, with respect to the array direction of the transparent parts 610, the size of the optical path length difference generation part 61 can be made greater than the size of the division lens part 62, and accordingly it is possible to easily produce the optical path length difference generation part 61. By achieving the functions of the lenses 53 and 54 in FIG. 12 with use of the intermediate magnification part 64*a* on the backward path during the above forward and backward travel of the light, the overall length of the light irradiation apparatus 31*a* in the Z direction can be reduced while omitting the above lenses 53 and 54. Moreover, by causing the light flux that passes through each transparent part 610 to travel back and forth in the transparent part 610, the length of the optical path length difference generation part 61 in the direction of the optical axis J1 can be reduced (e.g., to a half of the length of the optical path length difference generation part 61 in FIG. 9 or 12).

Figure 16:
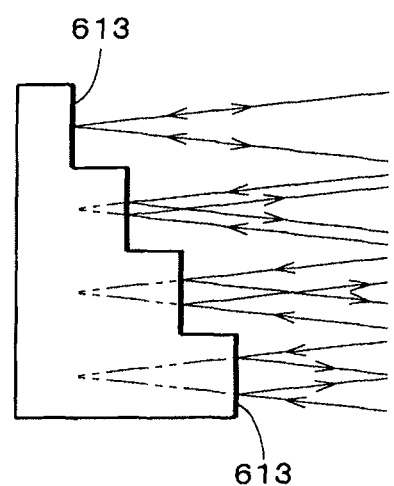
FIG. 16 illustrates another example of the optical path length difference generation part.

Although the light irradiation apparatus 31*a* in FIG. 14 can relatively reduce loss in the amount of light by using the polarization beam splitter 55 and the quarter-wave plate 56, it is possible to use other beam splitters such as a half mirror, depending on the design of the light irradiation apparatus 31. In addition, the quarter-wave plate 56 can be disposed at an arbitrary position between the polarization beam splitter 55 and the reflecting part 65. The same applies to other light irradiation apparatuses using the polarization beam splitter 55 and the quarter-wave plate 56. Moreover, the light irradiation apparatus 31*a* in FIG. 14 may include a mirror instead of the reflection film 651*a*. As another alternative, an optical path length difference generation part that includes mirrors (reflection surfaces) 613 disposed in a stepped manner may be used, instead of the aforementioned transparent type element, as illustrated in FIG. 16.

Figure 17:
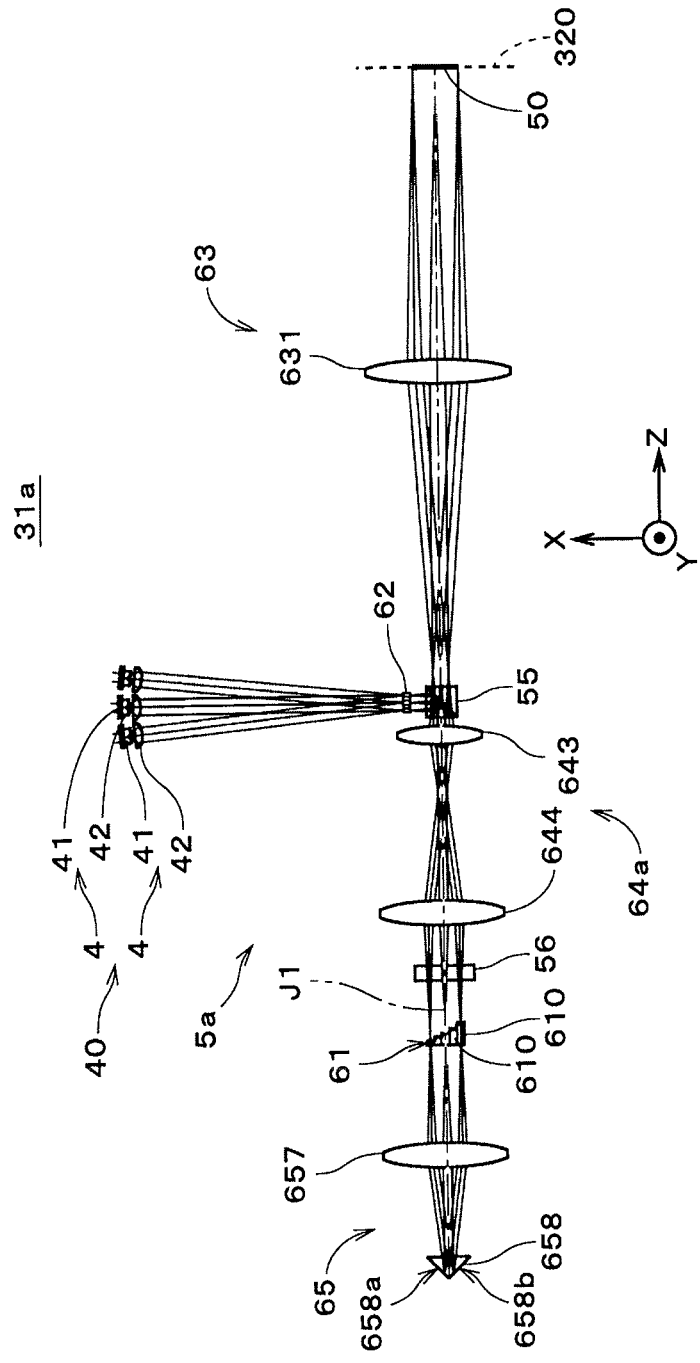
FIG. 17 illustrates another example of the light irradiation apparatus.
Figure 18:
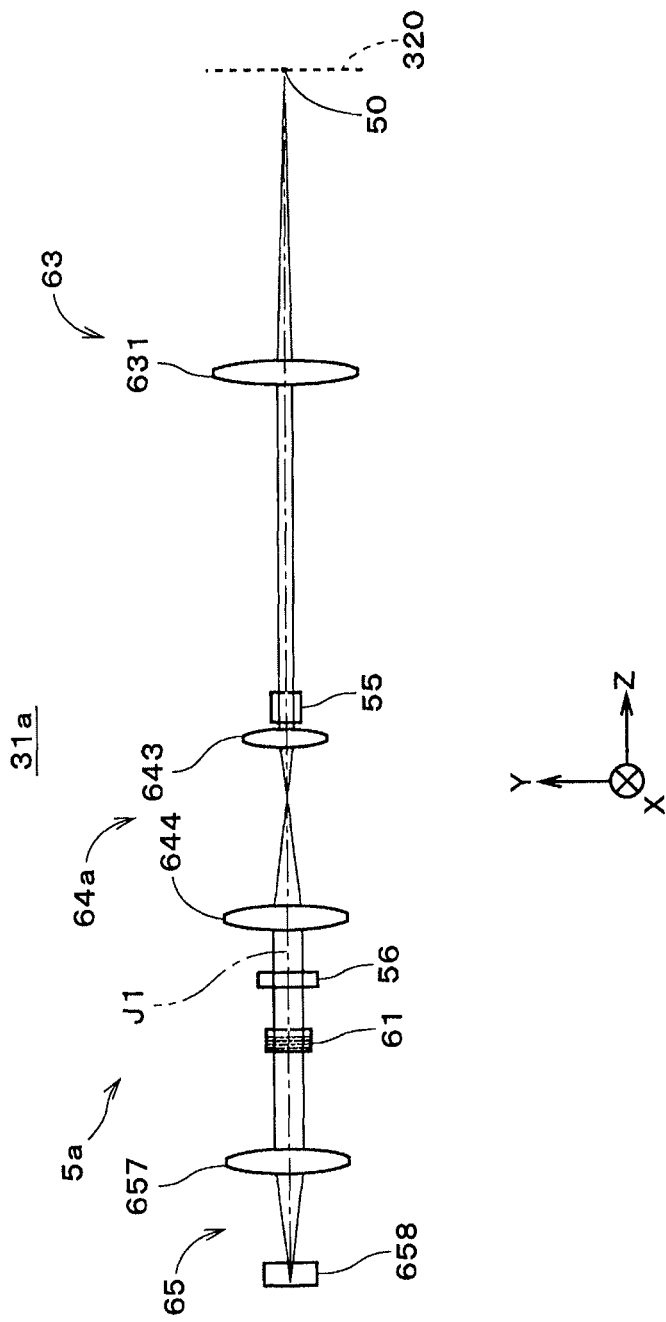
FIG. 18 illustrates another example of the light irradiation apparatus.

FIGS. 17 and 18 illustrate another example of the light irradiation apparatus 31*a*. FIG. 17 illustrates a configuration of the light irradiation apparatus 31*a* when viewed in the Y direction, and FIG. 18 illustrates the configuration of the light irradiation apparatus 31*a* when viewed in the X direction. The light irradiation apparatus 31*a* illustrated in FIGS. 17 and 18 includes a lens 657 and a right-angle prism 658, instead of the reflection film 651*a* of the light irradiation apparatus 31*a* in FIGS. 14 and 15. The other constituent elements are the same as those of the light irradiation apparatus 31*a* in FIGS. 14 and 15, and constituent elements that are the same as in FIGS. 14 and 15 are given the same reference numerals.

The lens 657 of the reflecting part 65 is disposed at a position spaced on the −Z side by the focal length of the lens 657 from the position at which the images of the exit surfaces of the element lenses 620 (see FIG. 11) are formed in the optical path length difference generation part 61. Thus, the light flux emitted from the exit surface 612, which is the −Z-side surface of each transparent part 610, toward the lens 657 is emitted as parallel light to the −Z side by the lens 657. The right-angle prism 658 is disposed at a position spaced on the −Z side by the focal length of the lens 657 from the lens 657. When viewed in the Y direction as illustrated in FIG. 17, each light ray incident on the right-angle prism 658 is reflected by one of two surfaces 658*a* and 658*b* that form an angle of 90 degrees to travel toward the other surface, is further reflected by the other surface, and travels toward the lens 657 in parallel with the path of incidence on the right-angle prism 658. The light incident on the lens 657 from the −Z side enters the optical path length difference generation part 61 while converging. In actuality, the light flux emitted from the exit surface 612 on the −Z side of each transparent part 610 is caused by the reflecting part 65 to turn around and return on the same path and enter the exit surface 612. Also, the light converging point of the light flux is formed inside or in the vicinity of the transparent part 610.

The light emitted in the +Z direction from the optical path length difference generation part 61 enters the polarization beam splitter 55 through the quarter-wave plate 56 and the intermediate magnification part 64a. The light passes through the polarization beam splitter 55 and enters the condensing lens 631. Then, the condensing lens 631 superimposes the irradiation regions 50 of the light from the plurality of element lenses 620 on one another on the irradiation plane 320.

It is assumed here that, when viewed in the X direction as illustrated in FIG. 18, the degree of parallelism of the entrance surface 611 and the exit surface 612 of the transparent part 610 varies for each transparent part 610. In this case, the light flux incident on the entrance surface 611 on the +Z side of each transparent part 610 as parallel light that is parallel to the optical axis J1 is emitted as parallel light from the exit surface 612 of the transparent part 610 in a direction of emission that is inclined with respect to the optical axis J1. This light flux is caused by the function of the lens 657 to converge to a position that is shifted from the optical axis J1 on the right-angle prism 658. The light flux reflected by the right-angle prism 658 is collimated by the lens 657 into parallel light that is parallel to the above direction of emission and enters the exit surface 612 of the transparent part 610. Accordingly, the light flux that has passed through the transparent part 610 is emitted from the entrance surface 611 in the +Z direction in parallel with the path of incidence on the transparent part 610 from the +Z side, irrespective of the degree of parallelism of the transparent part 610. Then, the irradiation regions 50 of the light from the plurality of transparent parts 610 are formed at (approximately) the same Y-direction position in the irradiation plane 320.

As described above, in the light irradiation apparatus 31a in FIGS. 17 and 18, the reflecting part 65 causes the light emitted from the exit surface 612 of each transparent part 610 to enter this exit surface 612 in parallel with the direction of emission of the light. Thus, even if the degree of parallelism (wedge component) varies among the plurality of transparent parts 610, the inclination of the plurality of light fluxes emitted in the +Z direction from the plurality of transparent parts 610 with respect to the optical axis J1 (inclination when viewed in the X direction) can coincide with the inclination thereof (ideally parallel to the optical axis J1) at the time of incidence on the optical path length difference generation part 61 from the +Z side. Consequently, it is possible to suppress or reduce shifts in the Y direction of the light condensing positions (light gathering position when viewed in the X direction) in the irradiation plane 320 of the plurality of light fluxes that have passed through the plurality of transparent parts 610, and to reduce an increase in the Y-direction width of the linear illumination light in the irradiation plane 320. Note that the reflecting part 65 may use, for example, two plane mirrors that form an angle of 90 degrees, instead of the right-angle prism 658.

The drawing apparatus 1 and the light irradiation apparatuses 31 and 31a described above can be modified in various ways.

The division lens part 62 does not necessarily have to have a plurality of element lenses 620 or 620a arrayed with a fixed pitch in the array direction. For example, the plurality of element lenses 620 or 620a may have different widths in the array direction. In this case, the widths in the array direction of the plurality of transparent parts 610 are also changed such that, with respect to the array direction, the ratio of the width of each transparent part 610 in the optical path length difference generation part 61 and the width of the element lens 620 or 620a corresponding to this transparent part 610 in the division lens part 62 is constant for all of the transparent parts 610.

The intermediate magnification part 64a does not necessarily have to constitute a double telecentric optical system, and may constitute an enlarging optical system in which the light that has passed through the plurality of element lenses 620 or 620a respectively enters the plurality of transparent parts 610.

On the path of the laser light in the above-described light irradiation apparatuses 31 and 31a, the condensing lens part 63 disposed closer to the irradiation plane 320 than the optical path length difference generation part 61 is may be achieved with various configurations as long as the irradiation regions 50 of the light from the plurality of transparent parts 610 can be superimposed on one another on the irradiation plane 320.

In the drawing apparatus 1, the spatial light modulator 32 disposed in the irradiation plane 320 of the light irradiation apparatus 31 or 31a may be a device other than a diffraction grating type light modulator. For example, a spatial light modulator using a group of minute mirrors may be used. In this case, irradiation regions having a relatively large Y-direction width may be formed in the irradiation plane 320 by the light irradiation apparatus 31 or 31a.

The movement mechanism for moving the irradiation position of the light on the substrate 9 may be a mechanism other than the movement mechanism 22 for moving the stage 21, and may, for example, be a movement mechanism for moving a head that includes the light irradiation apparatus 31 or 31a, the spatial light modulator 32, and the projection optical system 33 relative to the substrate 9.

An object on which the drawing apparatus 1 draws a pattern may be a substrate other than a semiconductor substrate or a glass substrate, or may be other than substrates. The light irradiation apparatuses 31 and 31a may be used in apparatuses other than the drawing apparatus 1.

The configurations of the above-described preferred embodiments and variations may be appropriately combined as long as there are no mutual inconsistencies.

While the invention has been shown and described in detail, the foregoing description is in all aspects illustrative and not restrictive. It is therefore to be understood that numerous modifications and variations can be devised without departing from the scope of the invention.

REFERENCE SIGNS LIST

1 Drawing apparatus
4 Light source part
5, 5a Irradiation optical system
9 Substrate
11 Control part
22 Movement mechanism
31, 31a Light irradiation apparatus
32 Spatial light modulator
33 Projection optical system
40 Light source unit
50 Irradiation region
61 Optical path length difference generation part 62 Division lens part
63 Condensing lens part
64a Intermediate magnification part
65 Reflecting part
320 Irradiation plane
610 Transparent part
612 Exit surface (of transparent part)
620, 620a Element lens
622 Second lens surface
J1 Optical axis

The invention claimed is:

1. A light irradiation apparatus comprising:
a light source unit including a plurality of light source parts arrayed in a plane and in which said plurality of light source parts emit laser light toward a predetermined position from different directions along said plane; and
an irradiation optical system disposed at said predetermined position and for guiding the laser light emitted from said light source unit along an optical axis to an irradiation plane,
said irradiation optical system including:
a division lens part including a plurality of lenses arrayed in an array direction that is perpendicular to said optical axis and along said plane, and for dividing light incident from said plurality of light source parts by said plurality of lenses, wherein light emitted from each of said plurality of light source parts enters each of said plurality of lenses;
an optical path length difference generation part including a plurality of transparent parts that are arrayed in said array direction and have different optical path lengths from each other, and in which a plurality of light fluxes that have passed through said plurality of lenses are incident respectively on said plurality of transparent parts, wherein each of said plurality of transparent parts has an entrance surface and an exit surface which are perpendicular to said optical axis; and
a condensing lens part disposed closer to said irradiation plane on a path of said laser light than said optical path length difference generation part is, and for superimposing irradiation regions of said plurality of light fluxes from said plurality of transparent parts on each other on said irradiation plane, wherein
images of a plurality of light sources included in said plurality of light source parts are formed in the vicinity of an exit surface of each of said plurality of lenses and said images are arranged in said array direction,
said plurality of light fluxes from said plurality of lenses enter said plurality of transparent parts while diverging in said array direction, and
said division lens part and said optical path length difference generation part are disposed sufficiently close to each other that, with respect to said array direction of said plurality of transparent parts, a width of light flux emitted from said exit surface of each of said plurality of transparent parts is smaller than a pitch of said plurality of transparent parts.

2. A drawing apparatus comprising:
the light irradiation apparatus according to claim 1;
a spatial light modulator disposed in said irradiation plane in said light irradiation apparatus;
a projection optical system for guiding light spatially modulated by said spatial light modulator onto an object;
a movement mechanism for moving an irradiation position of said spatially modulated light on said object; and
a control part for controlling said spatial light modulator in synchronization with the movement of said irradiation position caused by said movement mechanism.

3. The light irradiation apparatus according to claim 1, wherein
a condition expressed by the following Expression 1 is satisfied:

$$w_s \leq p'$$

where $$w_s = w_h + 2(d_s \cdot \tan \theta_d + t_s \cdot \tan \theta'_d), \text{ and}$$

$$p' = p - 2p_o \qquad \text{(Expression 1),}$$

where $w_s$ is a width in said array direction of light flux on said exit surface of a transparent part that has a largest length in a direction of said optical axis among said plurality of transparent parts,
p' is a width in said array direction of an effective region of said exit surface of each of said plurality of transparent parts,
$w_h$ is a width in said array direction of light flux on said exit surface of each of said plurality of lenses,
$d_s$ is a width of a space between said exit surface of each of said plurality of lenses and said entrance surface of each of said plurality of transparent parts,
$t_s$ is a length of said transparent part that has said largest length in said direction of said optical axis among said plurality of transparent parts,
$\theta_d$ is a half angle of divergence of light that passes through a light condensing point on said exit surface of each of said plurality of lenses,
$\theta'_d$ is a half angle of divergence of said light inside said optical path length difference generation part,
p is said pitch, and
$p_o$ is a width in said array direction of a non-effective region which is present at, and in the vicinity of, each edge of said exit surface of each of said plurality of transparent parts.

* * * * *